(12) United States Patent
Endo et al.

(10) Patent No.: US 7,643,077 B2
(45) Date of Patent: Jan. 5, 2010

(54) PHOTOELECTRIC CONVERSION APPARATUS AND PHOTOELECTRIC CONVERSION SYSTEM HAVING THE APPARATUS

(75) Inventors: Tadao Endo, Kanagawa-ken (JP); Noriyuki Kaifu, Hachioji (JP); Toshiaki Sato, Shizuoka-ken (JP); Masakazu Morishita, Hiratsuka (JP)

(73) Assignee: Canon Kabushiki Kaisha, Tokyo (JP)

( * ) Notice: Subject to any disclaimer, the term of this patent is extended or adjusted under 35 U.S.C. 154(b) by 203 days.

(21) Appl. No.: 11/620,997

(22) Filed: Jan. 8, 2007

(65) Prior Publication Data

US 2007/0115379 A1    May 24, 2007

Related U.S. Application Data

(62) Division of application No. 10/606,418, filed on Jun. 26, 2003, now Pat. No. 7,440,017, which is a division of application No. 08/815,532, filed on Mar. 12, 1997, now abandoned.

(30) Foreign Application Priority Data

| Mar. 13, 1996 | (JP) | ............................ 8-055880 |
| Mar. 6, 1997  | (JP) | ............................ 9-051701 |

(51) Int. Cl.
  *H04N 3/14* (2006.01)
(52) U.S. Cl. .................. 348/308; 348/300; 348/302; 348/304
(58) Field of Classification Search ............... 348/300, 348/301, 303–305, 307, 257
See application file for complete search history.

(56) References Cited

U.S. PATENT DOCUMENTS 4,612,454 A    9/1986    Kinoshita et al. ............ 307/311

(Continued)

FOREIGN PATENT DOCUMENTS

JP    62-185471    8/1987

(Continued)

*Primary Examiner*—Luong T Nguyen
(74) *Attorney, Agent, or Firm*—Fitzpatrick, Cella, Harper & Scinto

(57) ABSTRACT

In order to provide a photoelectric conversion apparatus, which is an apparatus excellent in reading speed, high S/N, high tone level, and low cost, the photoelectric conversion apparatus has a photoelectric conversion circuit section comprising a plurality of photoelectric conversion elements, switching elements, matrix signal wires, and gate drive wires arranged on a same substrate in order to output parallel signals, a driving circuit section for applying a driving signal to the gate drive wire, and a reading circuit section for converting the parallel signals transferred through the matrix signal wires to serial signals to output them, wherein the reading circuit section comprises at least one analog operational amplifier connected with each of the matrix signal wires, transfer switches for transferring output signals from the respective matrix signal wires, output through each amplifier, reading capacitors, and reading switches for successively reading the signals out of the reading capacitors in the form of serial signals.

2 Claims, 22 Drawing Sheets

U.S. PATENT DOCUMENTS

| | | | |
|---|---|---|---|
| 4,937,674 A | 6/1990 | Mizoguchi et al. | 358/213.12 |
| 4,996,413 A | 2/1991 | McDaniel et al. | 250/208.1 |
| 5,184,018 A | 2/1993 | Conrads et al. | 250/370.09 |
| 5,187,583 A | 2/1993 | Hamasaki | 358/213.15 |
| 5,198,905 A | 3/1993 | Miyake | 358/213.11 |
| 5,274,459 A * | 12/1993 | Hamasaki | 348/249 |
| 5,291,292 A | 3/1994 | Hotta | 348/308 |
| 5,296,696 A * | 3/1994 | Uno | 250/208.1 |
| 5,335,008 A | 8/1994 | Hamasaki | 348/301 |
| 5,335,094 A | 8/1994 | Kaifu et al. | 358/494 |
| 5,515,102 A | 5/1996 | Pearsall et al. | 348/241 |
| 5,539,196 A | 7/1996 | Miyawaki et al. | 250/208.1 |
| 5,569,908 A | 10/1996 | Bird et al. | 250/208.1 |
| 5,572,257 A * | 11/1996 | Conrads et al. | 348/308 |
| 5,770,847 A | 6/1998 | Olmstead | 235/462 |
| 5,808,677 A * | 9/1998 | Yonemoto | 348/308 |
| 5,933,189 A * | 8/1999 | Nomura | 348/302 |
| 5,942,774 A * | 8/1999 | Isogai et al. | 257/292 |
| 6,034,725 A | 3/2000 | Franklin et al. | 348/310 |

FOREIGN PATENT DOCUMENTS

| | | |
|---|---|---|
| JP | 62-251738 | 11/1987 |
| JP | 63-294182 | 11/1988 |
| JP | 03-231560 | 1/1991 |
| JP | 4-220239 | 8/1992 |
| JP | 4-281683 | 10/1992 |
| JP | 4-282953 | 10/1992 |
| JP | 4-321368 | 11/1992 |
| JP | 5-219302 | 8/1993 |
| JP | 5-316338 | 11/1993 |
| JP | 6-339082 | 12/1994 |
| JP | 7-264494 | 10/1995 |
| JP | 08-097965 | 4/1996 |

* cited by examiner

_US 7,643,077 B2_

PHOTOELECTRIC CONVERSION APPARATUS AND PHOTOELECTRIC CONVERSION SYSTEM HAVING THE APPARATUS

CROSS REFERENCE TO RELATED APPLICATIONS

This application is a division of application Ser. No. 10/606,418, filed Jun. 26, 2003, which is a division of application Ser. No. 08/815,532, filed Mar. 12, 1997. The entire disclosure of each of the prior applications is incorporated herein by reference.

BACKGROUND OF THE INVENTION

1. Field of the Invention

The present invention relates to a photoelectric conversion apparatus and a photoelectric conversion system having the apparatus. More particularly, the invention relates to a photoelectric conversion apparatus applicable to X-ray detectors for non-destructive examination such as medical care or internal examination, to image input units for business machines such as digital copiers, electronic blackboards, and facsimile machines, and so on, and also relates to a system having the apparatus.

2. Related Background Art

Presently, the majority of X-ray image pickup apparatus used for medical diagnosis employs a so-called film method in which X-rays are radiated to a human body, then the X-rays transmitted by the human body irradiate a fluorescent member for converting X-rays to visible light, and a film is exposed to fluorescence therefrom.

However, not only in Japan going into aging society, but also in the world, strong desires exist to improve the diagnostic efficiency in hospitals and to have higher-accuracy medical equipment. Even under such circumstances, the X-ray image pickup apparatus of the conventional film method requires a lot of time because of intervention of a development step of film before a doctor obtains a patient's X-ray image. In some incidents where the patient moves during X-ray photography and where exposure is misadjusted, photography must be carried out again. These are factors to impede an improvement in the efficiency of diagnosis and treatment in hospitals and also force a great load on the patient, which would be great hindrance against development to new medical society in future.

The demand for "digitization of X-ray image information" is increasing in the medical field these years. Once digitization is achieved, the doctor can know the patient's X-ray image information at optimum angles in real time, and the X-ray image information obtained can be recorded and managed using a medium such as a magneto-optical disk. Utilizing facsimile or another communication method or the like, the patient's X-ray image information can be sent within a short time to any hospital in the world.

In the non-destructive examination typified by examination of the inside of an object such as a building body, it is not permissible to repeat setting of various devices for X-ray photography or to repeat photography of necessary parts, either. In the case of the film method, however, whether photography of necessary parts is completed cannot be found before the end of development in such examination, either. Since expert's judgment is made after completion of development of film, it is not possible for the expert to give an instruction of photography at another in situ angle or an instruction of treatment in situ when necessary.

Accordingly, a demand is also high for acquisition of X-ray image information of desired parts in real time in this field.

Then, recently proposed in order to meet the demand for "digitization of X-ray image information" are X-ray image pickup devices using CCD solid state image sensing devices or amorphous silicon photoelectric conversion elements instead of the film.

FIG. 1 is an equivalent circuit diagram of an example of the two-dimensional photoelectric conversion apparatus applicable to such X-ray image pickup apparatus. FIG. 1 illustrates the two-dimensional photoelectric conversion apparatus of 3×3 for simplifying the description, but practical photoelectric conversion apparatus are constructed of much more bits, though depending upon the purpose of apparatus.

In FIG. 1, each of T1-1, T1-2, T1-3, T2-1, ..., T3-3 designates a switching element, each of S1-1, S1-2, S1-3, S2-1, ..., S3-3 a photoelectric conversion element, SR1 a shift register, SR2 a shift register, each of G1, G2, G3 a gate drive wire, each of M1, M2, M3 a signal wire, each of C1, C2, C3 an accumulating capacitors (e.g. equivalent additional capacitors added to a wiring), each of RES1, RES2, RES3 a reset switch, CRES a voltage pulse input section for reset, OP an operational amplifier, Ca an accumulated capacitance, each of U1, U2, U3 a switching element for read, each of N1, N2, N3 a gate drive wire for switching element U1 to U3, respectively, numeral 1 a photoelectric conversion circuit section, and numeral 2 a reading circuit section.

In FIG. 1, light hv incident to photoelectric conversion elements S1-1 to S3-3 is photoelectrically converted by the photoelectric conversion elements S1-1 to S3-3 to charges of photoelectric conversion signals, which are accumulated in interelectrode capacitances of the respective photoelectric conversion elements S1-1 to S3-3. These photoelectric conversion signals pass through transfer switch T1-1 to T3-3 and signal wire M1 to M3 to become parallel voltage outputs. Further, they are converted to serial signals by the reading switch circuit section to be taken out to the outside.

In the structural example of the photoelectric conversion apparatus of FIG. 1, the photoelectric conversion elements of 9-bit pixels in total are separated in three rows, each including three bits. The above-stated operation is carried out in row units in order.

FIG. 2 is a timing chart to show an example of the operation of the photoelectric conversion apparatus shown in FIG. 1.

Optical information (hv) input to the photoelectric conversion elements S1-1 to S1-3 in the first row is photoelectrically converted to signal charges, which are accumulated in interelectrode capacitors in the respective photoelectric conversion elements of S1-1 to S1-3. After a lapse of constant accumulation time, the shift register SR1 gives a first voltage pulse for transfer to the gate driving wire G1 during a period of time T1 to switch the transfer switch elements T1-1 to T1-3 on. This causes the signal charges accumulated in the respective interelectrode capacitors (S1-1 to S1-3) in the photoelectric conversion elements S1-1 to S1-3 to be transferred through the respective signal wires M1 to M3 to load capacitances C1 to C3, whereby potentials V1 to V3 of the respective load capacitances C1 to C3 are raised by a charge amount of signal (transfer operation).

Subsequently, the shift register SR2 successively gives voltage pulses to gate driving wires N1 to N3 to switch reading switches U1 to U3 on in order, thereby converting the signals of the first row having been transferred to the load capacitances C1 to C3 to serial signals, and after impedance transformation by the voltage follower type operational amplifier OP, the signal of three pixels (Vout) is output to the outside of the photoelectric conversion apparatus during a period of time T3 (reading operation).

After that, a voltage pulse CRES for reset is applied to reset switches RES1 to RES3 during a period of time T2 to reset the load capacitances C1 to C3, thereby getting ready for the reading operation of the next row (reset operation).

Then the shift register SR1 successively drives the gate driving wires G2, G3, thereby outputting data of the all pixels of the photoelectric conversion elements S2-1 to S3-3 in time series.

Since the photoelectric conversion apparatus of an area type in which photosensors are arrayed two-dimensionally is generally arranged to successively perform the operations of transfer, reading, and reset in row units as described above, the image signals from the photoelectric conversion apparatus are intermittently output as shown by Vout in FIG. 2. Namely, the time necessary for reading one row is T1+T3+T2, and in the case of the two-dimensional photoelectric conversion apparatus of 3×3 shown in FIG. 1, the time of three times thereof is necessary for reading the all bits. For example, the size of the photoelectric conversion apparatus portion of the medical X-ray image pickup apparatus is said to be approximately 40 cm×40 cm necessary for the example of the X-ray image pickup apparatus for photographing the lung part. Supposing it is formed in pixel pitch of 100 μm, the total pixel number will be as huge as 4000×4000=16 million pixels. Simply assuming that the structure shown in FIG. 1 is used to perform the reading operation, the time of 4000×(T1+T2+T3) is necessary. Actually, the time necessary for T3 becomes longer, and therefore, a normal arrangement is provided with a plurality of (N) reading circuit sections to permit parallel reading scanning of N bits, thereby reading the all pixels in the time of 4000×(T1+T2+T3/N).

However, in the photoelectric conversion apparatus for successively performing the operations of from transfer through reading to reset, even with employing such structure, the time necessary for reading pixels in one line (=4000/N pixels) needs to include the transfer time T1 and reset time T2 every time of reading the pixels in each line, and therefore, the apparatus has a problem that the scanning time of photoelectric conversion, especially, with a lot of pixels was sometimes longer than expected. Especially, when the transfer switching elements (T1-1 to T3-3) are constructed of amorphous silicon (hereinafter referred to as "a-Si") TFTs (Thin Film Transistors) highly advantageous in respect of cost, they are not sufficient in switching performance as compared with switch elements made of single-crystal silicon, which leaves a subject of an improvement in achieving higher-speed reading of photoelectric conversion apparatus.

The load capacitors are illustrated as capacitance elements of reading capacitors C1 to C3 in FIG. 1, but practically, without a need for provision of separate elements, they are normally comprised of the interelectrode capacitances (Cgs) formed by the gate electrodes of the switching elements T1-1 to T3-3 and the electrodes on the side of signal wires M1 to M3. For example, when the signal charge of S1-1 in the first row is transferred, the capacitance of the load capacitor (reading capacitor) C1 is the sum of Cgs of the switching elements T1-1, T2-1, and T3-1 parasitic on the signal wire M1. Similarly, for example, when the signal charge of S2-2 in the second row is transferred, the capacitance of C2 is the sum of Cgs of the switching elements T1-2, T2-2, and T3-2 parasitic on the signal wire M2. In summary, whenever a signal charge of any photoelectric conversion element is transferred, the load capacitor (C1 to C3) is given by addition of three capacitances of Cgs of the switching elements. Similarly, when the two-dimensional photoelectric conversion apparatus is constructed of 4000×4000 pixels, the load capacitance of each signal line in the matrix will have the capacitance of Cgs×4000. On the other hand, when the signal charges of the load capacitances are converted to serial signals by the switching elements U1 to U3 in the reading circuit section, each signal charge is virtually transferred to the input capacitance (Ca in FIG. 1) parasitic to the input of the analog operational amplifier (OP amp) OP. When the transfer switching elements are made of a-Si, impedance transformation is achieved with little reducing the signal potential of the load capacitance, because the load capacitance of Cgs×4000>>Ca.

Also, there is a possibility of raising a problem that upon performing the transfer operation from the load capacitor (C1 to C3) to the operational amp OP side through the switching element (U1 to U3) controlled by the shift register SR2, the thermal noise occurring due to thermal agitation of carriers in the switching elements might degrade S/N of the photoelectric conversion apparatus in some cases. The effective value Vj of this thermal noise voltage is given, generally, by $$Vj = (4KTRB)^{1/2} (\text{Vrms}).$$

Here, K is the Boltzmann constant, $1.38 \times 10^{-23}$ (J/K), T is an absolute temperature (K), and B is the frequency bandwidth (Hz) of system. Further, R is a resistance (Ω) in the case of the thermal noise occurring in a resistor. In the case of this system, it may be considered as ON resistance (Ω) of the switching elements.

Letting CL be the matrix-side capacitance (Cgs×4000) and Ca be the input capacitance on the operational amp OP side, the frequency bandwidth B can be approximated as B=1/(4R(CL∥Ca)) in the thermal noise voltage $Vj=(4KTRB)^{1/2}$ (Vrms), and therefore, $$Vj = (4KTR/(4R(CL \parallel Ca)))^{1/2}$$
$$= (KT/(CL \parallel Ca))^{1/2}.$$

Here, CL∥Ca is series combined capacitance of CL and Ca.

Incidentally, if it is expressed as a charge amount, $Qj=CV=(KT/(CL \parallel Ca))^{1/2}$(Vrms). Namely, the thermal noise voltage Vj occurring in such a system is determined only by the Boltzmann constant K, temperature T, and capacitance C (=CL∥Ca), which is normally called KTC noise. Unless otherwise stated, the thermal noise voltage will be called "KTC noise" hereinafter. This KTC noise is given in the simplified form of $(KT/(CL \parallel Ca))^{1/2}$(Vrms). Since CL>>Ca, the KTC noise is determined nearly by $(kT/Ca)^{1/2}$. The noise of this type can be reduced by increasing Ca, but there is limitation on increase in the capacitance formed in an integrated circuit (IC).

Similarly, the KTC noise also occurs upon resetting the load capacitances to the reset potential by the reset switches RES1 to RES3, which raises the problem of reduction in S/N of the photoelectric conversion apparatus. This KTC noise upon reset is given by $(KT/CL)^{1/2}$(V). The KTC noise occurring upon transfer and the KTC noise occurring upon reset appears as random noise of photoelectric conversion apparatus. Especially, if high-definition and high-gradation-level information is desired to obtain as in the medical X-ray image pickup apparatus, the apparatus will necessitate the photoelectric conversion apparatus with higher S/N ratios than the business machines such as copiers or electronic blackboards, and, the KTC noise could be a big problem.

In the photoelectric conversion circuit section, letting CS be the interelectrode capacitance of single photoelectric conversion element, CL be the load capacitance in the matrix signal wire, and Q be a total amount of accumulated signal charge after photoelectrically converted by the photoelectric conversion element, the signal potential V of the load capacitance CL on the matrix signal wire, after transfer by the transfer switching element, is given by V=Q/(CS+CL). Since single interelectrode capacitance CS is much smaller than the load capacitance CL composed of the 4000 interelectrode capacitances Cgs, it is practically approximated by V=Q/CL. When the switching elements having the interelectrode capacitance Cgs are made of an a-Si semiconductor thin film, individual differences will appear in capacitance values of load capacitance CL among apparatus because of dispersion in film thickness on fabrication of thin film, which would raise a problem that apparatus with high output and apparatus with low output are manufactured. In order to overcome it, upon constructing the system, such a countermeasure is taken as to add a general-purpose OP amp to adjust the gain, but the above example necessitates N general-purpose amplifiers, which will raise the cost of apparatus when also taking the adjustment process into consideration.

Also, the N reading circuit sections (ICs), especially in the equipment requiring high S/N ratios like the medical equipment, are not preferred to be located with long extension of the signal wires also in respect of an anti-noise property, but the necessary circuits are desired to be mounted near the photoelectric conversion circuit section. However, if many (N) ICs are provided, heat generation thereof will increase the temperature of the photoelectric conversion circuit section in some cases. Especially, when the switching elements are amorphous silicon TFTs, it is said that the dark current during OFF will increase, and there is a possibility of raising another problem that the heat generation of ICs could increase fixed pattern noise of photoelectric conversion apparatus.

For example, when the photoelectric conversion apparatus portion of the medical X-ray image pickup apparatus is constructed of a solid state image sensing apparatus, the noise quantity required for the whole apparatus including the photoelectric conversion elements is said to be $1/10000$ or less against the dynamic range of signal if the image quality higher than that of the film method is desired to achieve. Namely, the resolution of 14 or more bits is required as performance of the A/D converter necessary for achieving the "digitization of X-ray image information." A/D converters of 16 bits are commercially available presently, but it is a present status that the conversion speed decreases with increase of bit number, and to date there has been and is no high-speed A/D converter of 14 or more bits that can be used practically and actually in the X-ray image pickup apparatus having the photoelectric conversion apparatus of 4000×4000 pixels as described above.

SUMMARY OF THE INVENTION

An object of the present invention is to provide a photoelectric conversion apparatus that can reduce the read scanning time so as to enable high-speed reading and also to provide a system having the apparatus.

Another object of the present invention is to provide a photoelectric conversion apparatus that can perform signal reading at high S/N with little generation of thermal noise (KTC noise) and also to provide a system having the apparatus.

An additional object of the present invention is to provide a photoelectric conversion apparatus that can obtain good image information without density unevenness or unnecessary stripes, reduced in fixed pattern noise, and also to provide a system having the apparatus.

A further object of the present invention is to provide a photoelectric conversion apparatus that can obtain image information excellent in tone level and also to provide a system having the apparatus.

Still another object of the present invention is to provide a photoelectric conversion apparatus that can be corrected readily for nonuniformity of characteristic such as one caused by manufacturing dispersion of photoelectric conversion element or the like, thereby enabling further promotion of cost reduction and also to provide a system having the apparatus.

An object of the present invention is to provide a photoelectric conversion apparatus having a photoelectric conversion circuit section comprising a plurality of photoelectric conversion elements, switching elements, matrix signal wires, and gate drive wires arranged on a same substrate in order to output parallel signals, a driving circuit section for applying a driving signal to said gate drive wire, and a reading circuit section for converting the parallel signals transferred through said matrix signal wires to serial signals to output the serial signals, wherein said reading circuit section comprises at least one analog operational amplifier connected with each of said matrix signal wires, transfer switches for transferring output signals from said respective matrix signal wires, output through each said analog operational amplifier, reading capacitors for accumulating said output signals transferred, and reading switches for successively reading signals out of said reading capacitors in the form of serial signals.

A further object of the present invention is to provide a photoelectric conversion system having at least: a photoelectric conversion apparatus having a photoelectric conversion circuit section comprising a plurality of photoelectric conversion elements, switching elements, matrix signal wires, and gate drive wires arranged on a same substrate in order to output parallel signals, a driving circuit section for applying a driving signal to said gate drive wire, and a reading circuit section for converting the parallel signals transferred through said matrix signal wires to serial signals to output the serial signals; and a light source;

wherein said reading circuit section of said photoelectric conversion apparatus comprises at least one analog operational amplifier connected with each of said matrix signal wires, transfer switches for transferring output signals from said respective matrix signal wires, output through each said analog operational amplifier, reading capacitors for accumulating said output signals transferred, and reading switches for successively reading signals out of said reading capacitors in the form of serial signals.

DETAILED DESCRIPTION OF THE PREFERRED EMBODIMENTS

Figure 1:
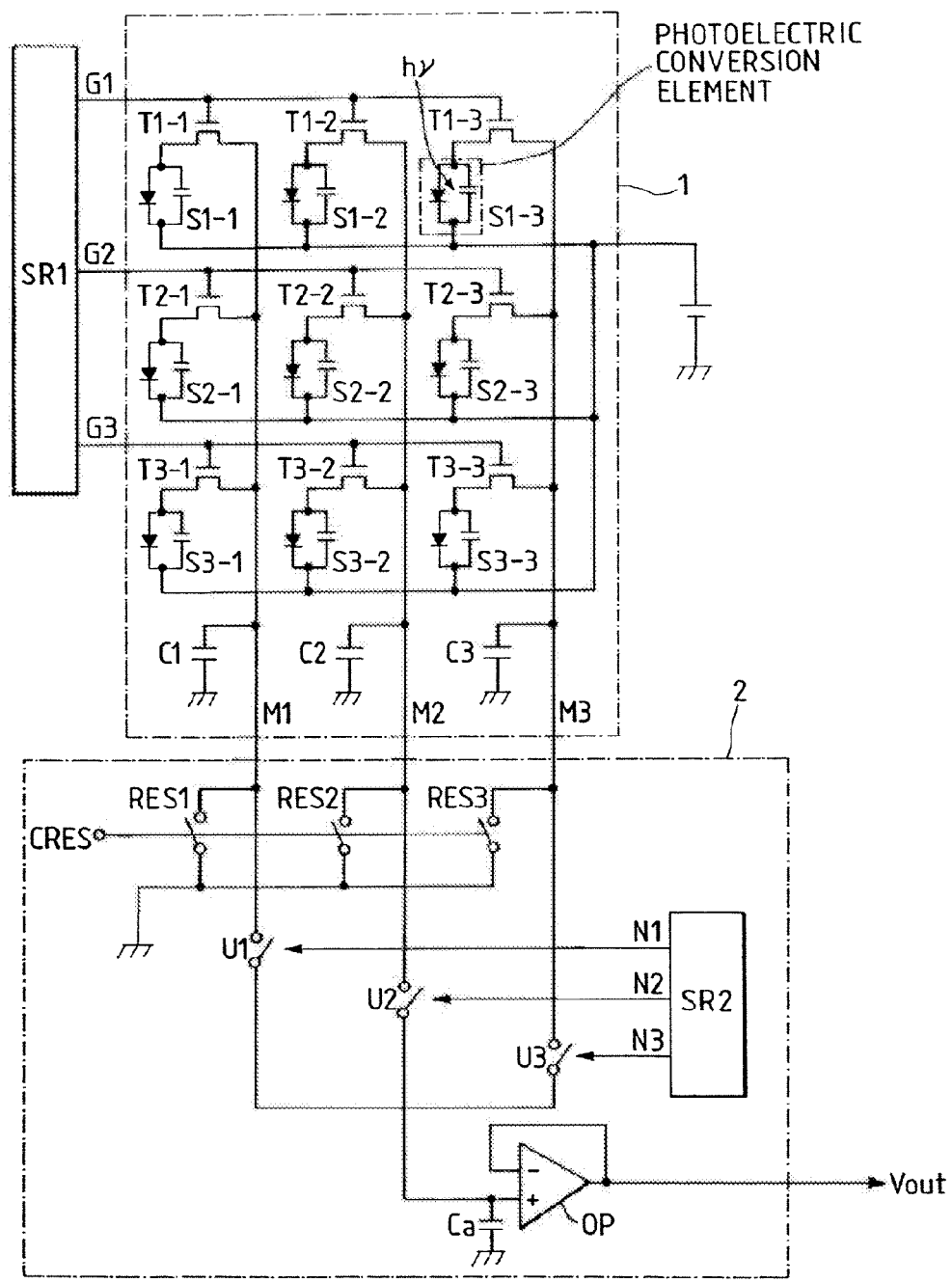
FIG. 1 is a schematic circuit diagram for explaining an example of the photoelectric conversion apparatus.
Figure 2:
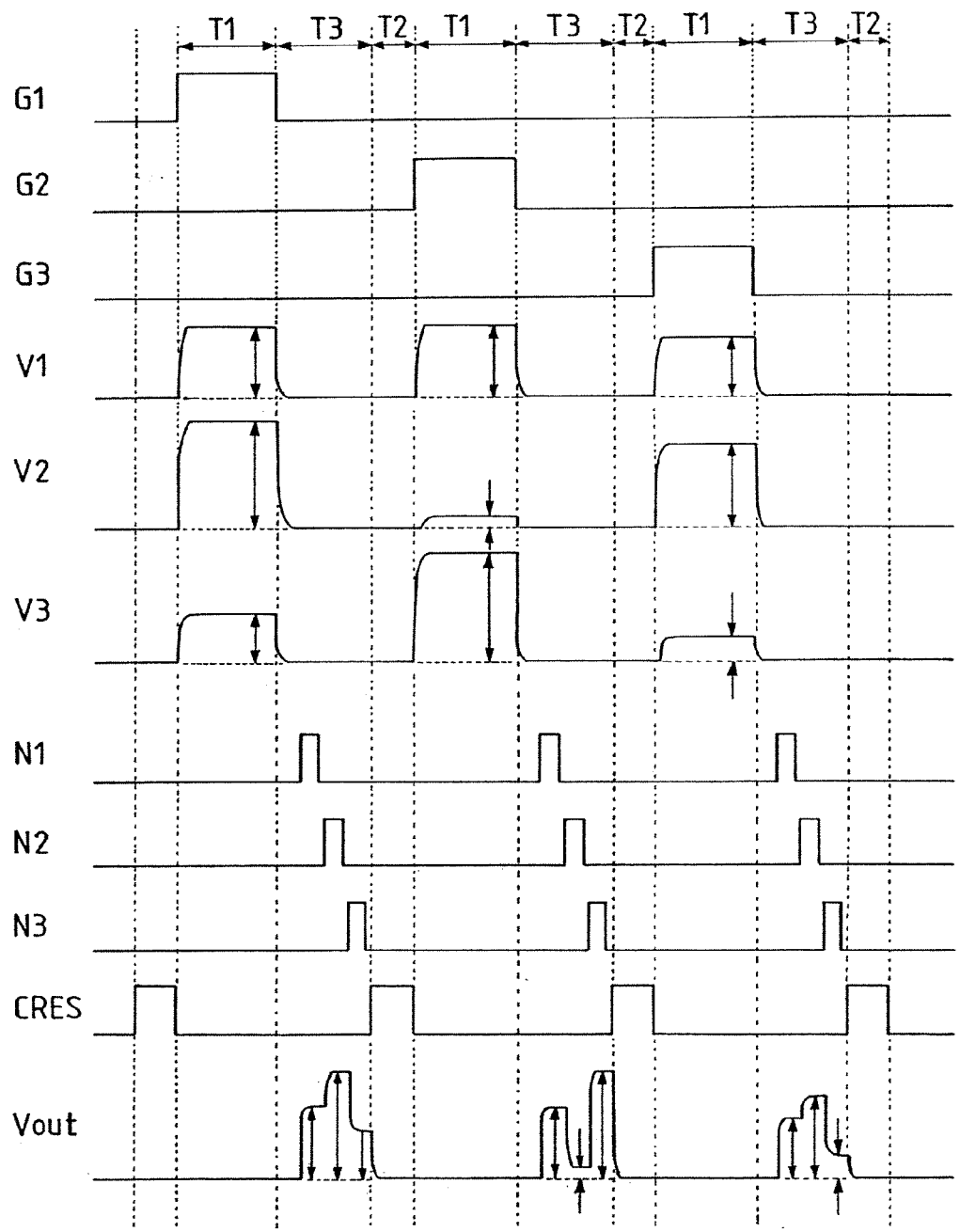
FIG. 2 is a timing chart for explaining an example of the driving method of the photoelectric conversion apparatus.

The present invention will be described with reference to the drawings if necessary.

For solving the above various problems, for example, a photoelectric conversion apparatus of the present invention has a photoelectric conversion circuit section comprising a plurality of photoelectric conversion elements, switching elements, matrix signal wires, and gate drive wires arranged on a same substrate in order to output parallel signals, a driving circuit section for applying a driving signal to said gate drive wire, and a reading circuit section for converting the parallel signals transferred through said matrix signal wires to serial signals to output them, wherein said reading circuit section comprises at least one analog operational amplifier connected in cascade connection with each of said matrix signal wires, transfer switches for transferring output signals from said respective matrix signal wires, output through the analog operational amplifiers, reading capacitors for accumulating said output signals transferred, and reading switches for successively reading signals out of said reading capacitors in the form of serial signals.

Also, it is preferable that in said reading circuit section, said analog operational amplifier of first stage connected to each of the matrix signal wires have a noise voltage density $Vn$ $(V/\sqrt{Hz})$ converted at an input terminal portion thereof and a frequency band $B$ (Hz) enough to amplify a signal from said photoelectric conversion circuit section and satisfy the relation of: $Vn \times \sqrt{B} \leq Tn$ against thermal noise effective voltage $Tn$ (Vrms) of said switching element at the input terminal portion of said analog operational amplifier, occurring when the switching element in said photoelectric conversion circuit section is turned on.

Further, it is preferable that in said reading circuit section, a capacitor element for letting only alternating-current components pass be connected to midway of an output wire from an output terminal of said analog operational amplifier connected with each of said matrix signal wires and that a reset switch for DC restoration of said capacitor element be provided.

Also, it is preferable that in said reading circuit section, the at least one analog operational amplifier connected with each of the matrix signal wires be provided with a function to change an amplification factor thereof by a signal from the outside.

In addition, it is preferable that in said reading circuit section, the analog operational amplifier connected with each of the matrix signal wires be provided with a function to reduce a consumption electric current thereof by a signal from the outside.

Also, it is preferable that an A/D conversion circuit section for converting an analog signal to a digital signal be connected to said reading circuit section, that this A/D conversion circuit section comprise N (N is an integer of not less than 2) operational amplifiers for amplifying a signal from said reading circuit section and N A/D converters of M bits, that a ratio of amplification factors $G1, G2, \ldots, GN$ of said N operational amplifiers be set to $G1:G2: \ldots :GN = 2^0:2^1: \ldots :2^{N-1}$, that outputs from said N operational amplifiers each be input to said N A/D converters, and that an output of one A/D converter be selected out of said N A/D converters in accordance with an output level of an analog signal from said reading circuit section and be output as a digital value of (N+M−1) bits.

Also, the foregoing reading circuit section is configured preferably in such an arrangement that near the first analog operational amplifier (amp 1) connected to each of the matrix signal wires there is provided another analog operational amplifier (amp 2), the amp 1 is constructed as a non-inverting amplifier having an amplification factor of not less than 1×, the amp 2 is constructed as a buffer amplifier having an amplification factor of 1×, and a reference potential to be a reference of operation of the amp 1 is supplied from an output terminal of the amp 2.

Also, the reading circuit section is configured preferably in such an arrangement that a capacitor element for passing only ac components is connected to midway of an output wire from an output terminal of the analog operational amplifier connected to each of the matrix signal wires, a reset switch for dc restoration of the capacitor element is provided, and a resistance element is interposed between the capacitor element and the reset switch.

Also, the reading circuit section is configured preferably in such an arrangement that a capacitor element for passing only ac components is connected to midway of an output wire from an output terminal of the analog operational amplifier connected to each of the matrix signal wires, a reset switch for dc restoration of the capacitor element is provided, a resistance element is interposed between the capacitor element and the reset switch, and there is provided a function for varying an on/off time of the reset switch by a signal from the outside.

Also, the reading circuit section is configured preferably in such an arrangement that a capacitor element for passing only ac components is connected to midway of an output wire from an output terminal of the analog operational amplifier connected to each of the matrix signal wires, a reset switch for dc restoration of the capacitor element is provided, and a low-pass filter circuit is connected to a terminal out of those of the capacitor element, opposite to a terminal connected to the output of the analog operational amplifier.

Also, the reading circuit section is configured preferably in such an arrangement that the at least one analog operational amplifier connected with each of the matrix signal wires has a function to vary a slew rate thereof by a signal from the outside.

Further, it is preferable that the photoelectric conversion elements and switching elements in said photoelectric conversion circuit section be made using an amorphous silicon semiconductor as a semiconductor material.

Also, the apparatus may be configured in such an arrangement that each of the photoelectric conversion elements is comprised of, from the insulating substrate side, a first metal thin-film layer (first electroconductive layer) as a lower electrode, an amorphous silicon nitride insulating layer (a-SiNx) for preventing passage of electron carriers and hole carriers, a hydrogenated amorphous silicon photoelectric conversion layer (a-Si:H) as a semiconductor layer, an n-type injection preventing layer for preventing injection of hole carriers, and a transparent electroconductive layer or a second metal thin-film layer located in a part on the injection preventing layer, as an upper electrode (second electroconductive layer), that each of the switching elements (thin-film transistors) is comprised of, from the insulating substrate side, a first metal thin-film layer as a lower gate electrode, a gate insulating layer (a-SiNx) of amorphous silicon nitride, a hydrogenated amorphous silicon semiconductor layer (a-Si:H), an n-type ohmic contact layer, and a transparent electroconductive layer or a second metal thin-film layer as a source or drain electrode, that the photoelectric conversion elements and the switching elements are formed on the same insulating substrate, that in a refresh mode an electric field is applied to the photoelectric conversion elements in such a direction as to guide hole carriers from the photoelectric conversion layer to the second metal thin-film layer, that in a photoelectric conversion mode an electric field is applied to the photoelectric conversion elements in such a direction as to keep carriers generated by light incident to the photoelectric conversion layer, staying in the photoelectric conversion layer and as to guide electron carriers to the second metal thin-film layer, and that the photoelectric conversion mode is arranged to detect as a light signal the hole carriers accumulated in the photoelectric conversion layer or the electron carriers guided to the second metal thin-film layer.

Also, the apparatus may be configured in such an arrangement that the photoelectric conversion elements are divided into a plurality of groups, the photoelectric conversion elements in each group can be set in the refresh mode independently of the other groups, and the photoelectric conversion elements in each group can be set in the photoelectric conversion mode independently of the other groups.

In addition, the apparatus may have a wavelength converting member such as a fluorescent member.

It is preferable to provide a grid between the light source and the photoelectric conversion apparatus.

According to the present invention, row scanning can be performed almost within only the reading time in reading scanning of each row, as compared with the operation time in the case of one set including the sequence of from transfer through reading to reset, thus enabling great increase in the reading speed of the photoelectric conversion apparatus.

Also, in said reading circuit section, the first-stage analog operational amplifier connected to each of the matrix signal wires has a noise voltage density Vn ($V/\sqrt{HzH}$) converted at an input terminal portion thereof and a frequency band B (Hz) enough to amplify a signal from said photoelectric conversion circuit section and satisfies the relation of: $Vn \times \sqrt{B} \leq Tn$ against thermal noise effective voltage Tn (Vrms) of said switching element at the input terminal portion of said analog operational amplifier, occurring when the switching element in said photoelectric conversion circuit section is turned on, which can reduce the drop of S/N due to the KTC noise upon transfer.

Further, in said reading circuit section, a capacitor element for letting only alternating-current components pass is connected to midway of an output wire from an output terminal of the analog operational amplifier connected in cascade connection with each of the matrix signal wires and a reset switch for DC restoration of the capacitor element is provided, which can reduce the drop of S/N due to the KTC noise upon reset. Further, the reduction in the drop of S/N due to those KTC noise will result in the operational effect of achieving high-quality image information with less random noise.

Also, in said reading circuit section, the analog operational amplifier connected with each of the matrix signal wires is provided with a function to reduce a consumption electric current thereof by a signal from the outside, which can reduce the dark current upon OFF of the transfer switching elements due to heat generation of IC, which can reduce the fixed pattern noise, and which can achieve images without density unevenness and without stripes in the image plane.

In addition, according to the present invention, an output of one A/D converter is selected out of the N A/D converters in accordance with an output level of an analog signal from the reading circuit section and is output as a digital value of (N+M−1) bits, which enables high-resolution and high-speed A/D conversion of photoelectric conversion signals, which achieves a high-tone-level photoelectric conversion apparatus, and which can provide a high-performance X-ray image pickup apparatus using it.

Further, the photoelectric conversion elements and switching elements in said photoelectric conversion circuit section are made of the amorphous silicon semiconductor material, which permits a large-area photoelectric conversion apparatus to be provided cheaply. In addition, when in said reading circuit section the at least one analog operational amplifier connected with each of the matrix signal wires is provided with the function capable of controlling the amplification factor by a signal from the outside, it can compensate for the gain dispersion caused by the film thickness dispersion on fabrication of amorphous silicon semiconductor thin film easily and cheaply.

The reference potential of amp 1 can be stabilized so as to obtain accurate photoelectric conversion signals and also enhance S/N by configuring the reading circuit section in such an arrangement that near the first analog operational amplifier (amp 1) connected to each of the matrix signal wires there is provided another analog operational amplifier (amp 2), the amp 1 is constructed as a non-inverting amplifier having an amplification factor of not less than 1×, the amp 2 is constructed as a buffer amplifier having an amplification factor of 1×, and a reference potential to be a reference of operation of the amp 1 is supplied from an output terminal of the amp 2.

The low-pass filter can be configured upon dc restoration so as to decrease the random noise of the analog operational amplifiers and also enhance S/N by configuring the reading circuit section in such an arrangement that a capacitor element for passing only ac components is connected to midway of an output wire from an output terminal of the analog operational amplifier connected to each of the matrix signal wires, a reset switch for dc restoration of the capacitor element is provided, and a resistance element is interposed between the capacitor element and the reset switch.

S/N can be enhanced in a still image mode and the frame rate can be increased in a moving-picture mode so as to improve operability furthermore by configuring the reading circuit section in such an arrangement that a capacitor element for passing only ac components is connected to midway of an output wire from an output terminal of the analog operational amplifier connected to each of the matrix signal wires, a reset switch for dc restoration of the capacitor element is provided, a resistance element is interposed between the capacitor element and the reset switch, and there is provided a function for varying an on/off time of the reset switch by a signal from the outside.

The random noise of the analog operational amplifiers can be decreased so as to enhance S/N by configuring the reading circuit section in such an arrangement that a capacitor element for passing only ac components is connected to midway of an output wire from an output terminal of the analog operational amplifier connected to each of the matrix signal wires, a reset switch for dc restoration of the capacitor element is provided, and a low-pass filter circuit is connected to a terminal out of those of the capacitor element, opposite to a terminal connected to the output of the analog operational amplifier.

The apparatus becomes advantageous in reading weak photoelectric conversion signals necessitating noise reduction by configuring the reading circuit section in such an arrangement that the at least one analog operational amplifier connected with each of the matrix signal wires has a function to vary a slew rate thereof by a signal from the outside.

The apparatus becomes easier to get ready for the moving-picture mode by such an arrangement that each of the photoelectric conversion elements is comprised of, from the insulating substrate side, a first metal thin-film layer (first electroconductive layer) as a lower electrode, an amorphous silicon nitride insulating layer (a-SiNx) for preventing passage of electron carriers and hole carriers, a hydrogenated amorphous silicon photoelectric conversion layer (a-Si:H) as a semiconductor layer, an n-type injection preventing layer for preventing injection of hole carriers, and a transparent electroconductive layer or a second metal thin-film layer located in a part on the injection preventing layer, as an upper electrode (second electroconductive layer), that each of the switching elements (thin-film transistors) is comprised of, from the insulating substrate side, a first metal thin-film layer as a lower gate electrode, a gate insulating layer (a-SiNx) of amorphous silicon nitride, a hydrogenated amorphous silicon semiconductor layer (a-Si:H), an n-type ohmic contact layer, and a transparent electroconductive layer or a second metal thin-film layer as a source or drain electrode, that the photoelectric conversion elements and the switching elements are formed on the same insulating substrate, that in a refresh mode an electric field is applied to the photoelectric conversion elements in such a direction as to guide hole carriers from the photoelectric conversion layer to the second metal thin-film layer, that in a photoelectric conversion mode an electric field is applied to the photoelectric conversion elements in such a direction as to keep carriers generated by light incident to the photoelectric conversion layer, staying in the photoelectric conversion layer and as to guide electron carriers to the second metal thin-film layer, and that the photoelectric conversion mode is arranged to detect as a light signal the hole carriers accumulated in the photoelectric conversion layer or the electron carriers guided to the second metal thin-film layer.

The frame rate can be increased substantially in the moving-picture mode so as to obtain a lot of sequential images by such an arrangement that the photoelectric conversion elements are divided into a plurality of groups, the photoelectric conversion elements in each group can be set in the refresh mode independently of the other groups, and the photoelectric conversion elements in each group can be set in the photoelectric conversion mode independently of the other groups.

The contents of the present invention will be described in detail with embodiments thereof with reference to the drawings.

Embodiment 1

Figure 3:
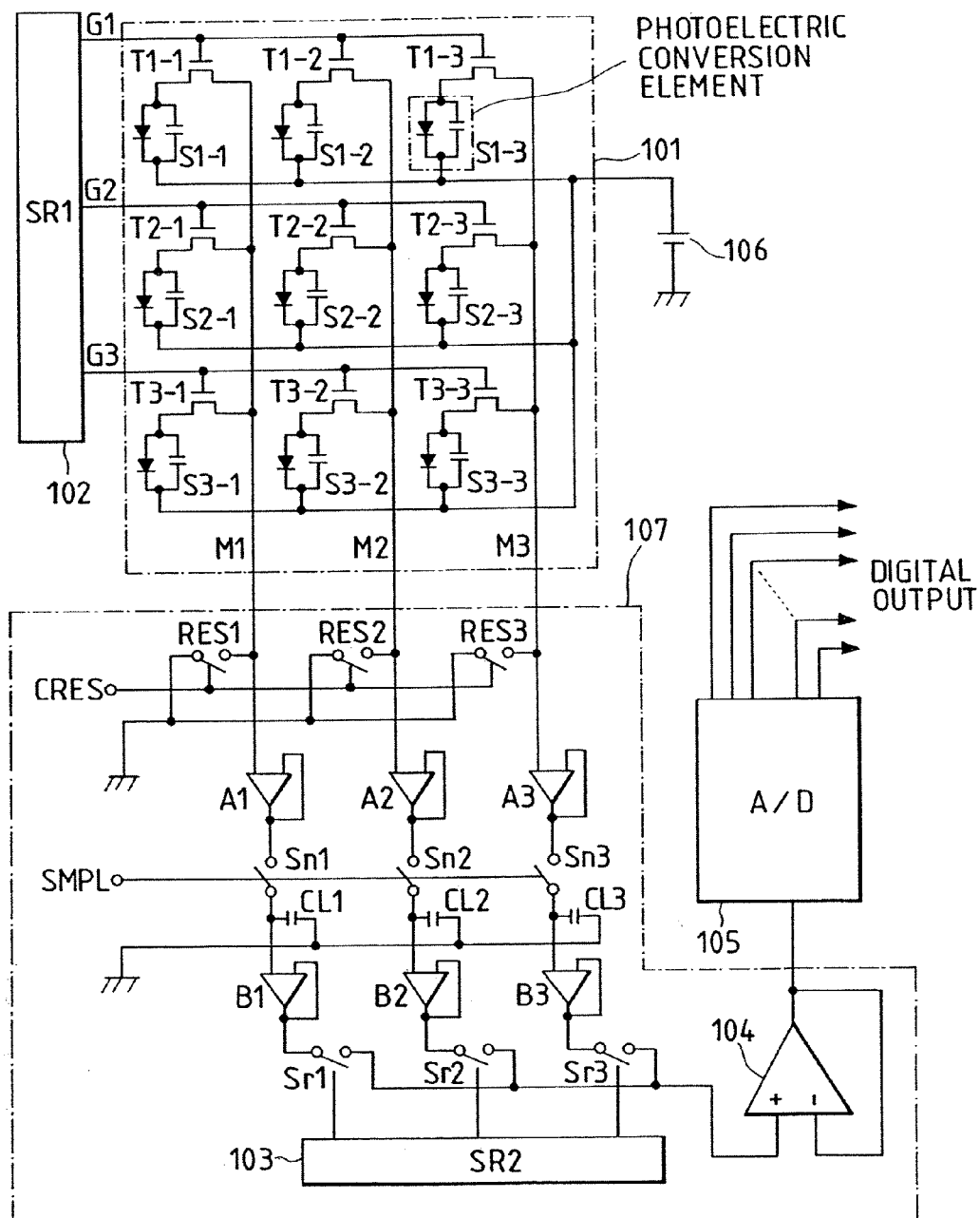
FIG. 3 is a schematic circuit diagram for explaining an example of the photoelectric conversion apparatus.

FIG. 3 is a circuit diagram of a photoelectric conversion apparatus to show the first embodiment of the present invention. For simplifying the description, the figure illustrates the structure of 3×3, nine pixels in total. Further, the same members as those in FIG. 1 will be denoted by the same symbols. S1-1 to S3-3 are photoelectric conversion elements for receiving the visible light and converting it to electric signals, and T1-1 to T3-3 are switch elements for transferring signal charges obtained by photoelectric conversion in the photoelectric conversion elements S1-1 to S3-3 to the matrix signal wires M1 to M3. G1 to G3 represent wires for driving the gates of switches, connected to the shift register (SR1) and connected to the switch elements T1-1 to T3-3. The capacitance comprised of three interelectrode capacitances (Cgs) of switch elements is applied to the matrix signal wire M1 upon transfer, as described above, and it is not illustrated as a capacitor element in FIG. 3. The same is also applied to the other matrix signal wires M2, M3. There are photoelectric conversion elements S1-1 to S3-3, switching elements T1-1 to T3-3, gate drive wires G1 to G3, and matrix signal wires M1 to M3 illustrated in the photoelectric conversion circuit section 101 in the drawing, and they are placed on one insulating substrate, though not shown. Numeral 102 denotes a driving circuit section comprised of a shift register (SR1) for switching the switch elements T1-1 to T3-3. A1 to A3 are OP amps for amplifying signal charges of the matrix signal wires M1 to M3 and performing impedance transformation thereof, each being described only as a buffer amplifier constituting a voltage follower circuit in the drawing. Sn1 to Sn3 are transfer switches, each reading an output from the OP amp A1 to A3, i.e., an output on each matrix signal wire M1 to M3 and transferring it to a capacitor CL1 to CL3. The reading capacitors CL1 to CL3 are read out by reading switches Sr1 to Sr3 through buffer amplifiers B1 to B3 constituting a voltage follower circuit. Numeral 103 designates a shift register (SR2) for switching the reading switches Sr1 to Sr3. The parallel signals of CL1 to CL3 are converted to serial signals by Sr1 to Sr3 and shift register (SR2) 103 and they are input into an OP amp 104 constituting a final-stage voltage follower circuit and further are digitized by an A/D conversion circuit section 105. RES1 to RES3 are reset switches for resetting the signal components accumulated in the capacitances (three Cgs's) applied to the matrix signal wires M1 to M3, which are reset to the reset potential (or reset to the GND potential in the drawing) by a pulse from CRES terminal. Further, 106 designates a power supply for applying a bias to the photoelectric conversion elements S1-1 to S3-3. The reading circuit section 107 is composed of the buffer amplifiers A1 to A3, transfer switches Sn1 to Sn3, reading capacitors CL1 to CL3, buffer amplifiers B1 to B3, reading switches Sr1 to Sr3, shift register SR2, final-stage OP amp 104, and reset switches RES1 to RES3.

Figure 4:
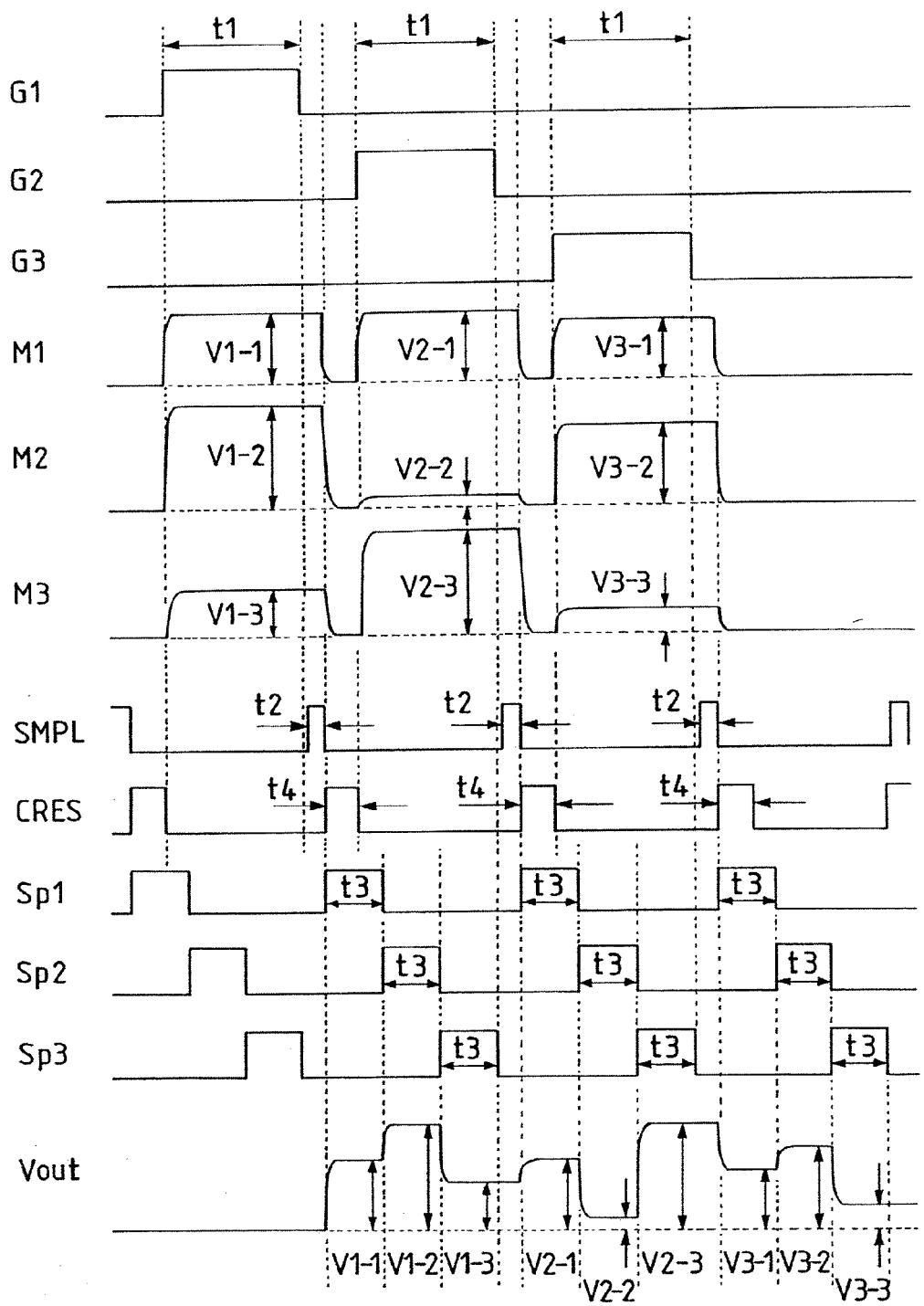
FIG. 4 is a timing chart for explaining an example of the driving method of the photoelectric conversion apparatus.

FIG. 4 is a timing chart to illustrate the operation of the photoelectric conversion apparatus shown in FIG. 3. Using FIG. 4, the details of the operation will be explained. The signal charges obtained by photoelectric conversion in the photoelectric conversion elements S1-1 to S3-3 are accumulated in the capacitance components formed in the photoelectric conversion elements only during a selected period. The signal charges having been accumulated in the photoelectric conversion elements S1-1 to S1-3 in the first row are transferred to the capacitance components (the capacitances of three Cgs's of the switching elements T1-1 to T3-3) formed in the respective matrix signal wires M1 to M3 while the gate pulse signal G1 of the shift register (SR1) 102 keeps the switching elements T1-1 to T1-3 "ON" only during a period of time t1. In FIG. 4 M1 to M3 indicate states of the transfer and show a case of different signal quantities stored in the respective photoelectric conversion elements. Namely, in the first-row photoelectric conversion elements (from S1-1 to S1-3), the output levels thereof indicate S1-2>S1-1>S1-3. The signal outputs on the matrix signal wires M1 to M3 are subjected to impedance transformation by the respective OP amps A1 to A3.

After that, the switching elements Sn1 to Sn3 in the reading circuit section are turned "ON" only during a period of time t2 by the SMPL pulse shown in FIG. 4 to transfer the signals to the reading capacitors CL1 to CL3. The signals in the reading capacitors CL1 to CL3 are subjected to impedance transformation by the respective buffer amplifiers B1 to B3. After that, the reading switches Sr1 to Sr3 are successively turned "ON" by shift pulses Sp1 to Sp3 from the shift register (SR2) 103, whereby the parallel signal charges having been transferred to the reading capacitors CL1 to CL3 are converted to serial signals to be read out. Supposing pulse widths of the shift pulses of Sp1, Sp2, Sp3 are determined to be Sp1=Sp2=Sp3=t3, the time necessary for this serial conversion read-out is given by t3×3. The serially converted signals are output from the final-stage OP amp 104 to be further digitized by the A/D conversion circuit section 105.

Vout shown in FIG. 4 indicates an analog signal before input to the A/D conversion circuit section. As shown in FIG. 4, the parallel signals of S1-1 to S1-3 in the first row, that is, the parallel signals of signal potentials on the matrix signal wires M1 to M3 are serially converted on the Vout signal in proportion to magnitudes of those signals. Finally, the signal potentials of the matrix signal wires M1 to M3 are reset to the predetermined reset potential (the GND potential) through the reset switch elements RES1 to RES3 by turning the CRES pulse "ON" only during a period of time t4, thereby getting ready for next transfer of signal charges in the second row of the photoelectric conversion elements S2-1 to S2-3. After that, photoelectrically converted signals of the second row and the third row are repetitively read out in the same manner.

Here, as seen from FIG. 4, according to the present invention, the two operations, the reset operation of capacitances of the matrix signal wires M1 to M3 in the first row and the transfer operation by the gate pulse G2 for the second-row photoelectric conversion elements S2-1 to S2-3, can be performed within the time range of t3×3 necessary for the reading operation of signal charges of CL1 to CL3 in the first row. Namely, the time necessary for reading of one row is t4+t1+t2, and this time can be set to be nearly equal to (t3×3)+t2. The capacitance formed in one of the matrix signal wires M1 to M3 is, in the case of FIG. 3, at most three times the interelectrode capacitance Cgs of the switching element connected to the photoelectric conversion element S2-1 to S2-3. However, as discussed above, each row includes several hundred to several thousand bits in the case of construction of actual photoelectric conversion elements, and therefore, the capacitance value becomes very large as compared with the reading capacitor CL. In that case, the time t2 necessary for transfer by the SMPL pulse is sufficiently determined to be about the time of several times the time constant determined by the product of the capacitance value of reading capacitor CL and the ON resistance value of the switch element Snx (x:1 to 3). If the reading circuit section 107 is constructed of an integrated circuit (IC) formed on a substrate material of ordinary crystal silicon, the operation can be carried out during the period of time t2 determined as a time sufficiently shorter than each time of t1, t3, or t3×3. Namely, the time necessary for reading the signal charges of the first-row photoelectric conversion elements can be set to approximately t4+t1=t3×3. This means that reading of one row in the aforementioned example required the time of (the time t1 necessary for transfer from the photoelectric conversion elements to the matrix signal wires)+(the time t3×3 necessary for reading the signals of matrix signal wires out)+(the time t4 necessary for resetting the capacitance components of matrix signal wires), whereas the present invention permits one row to be read out for the time of (the time t3×3 necessary for reading the signals of matrix signal wires), thus greatly decreasing the reading time of the photoelectric conversion apparatus.

Figure 5A:
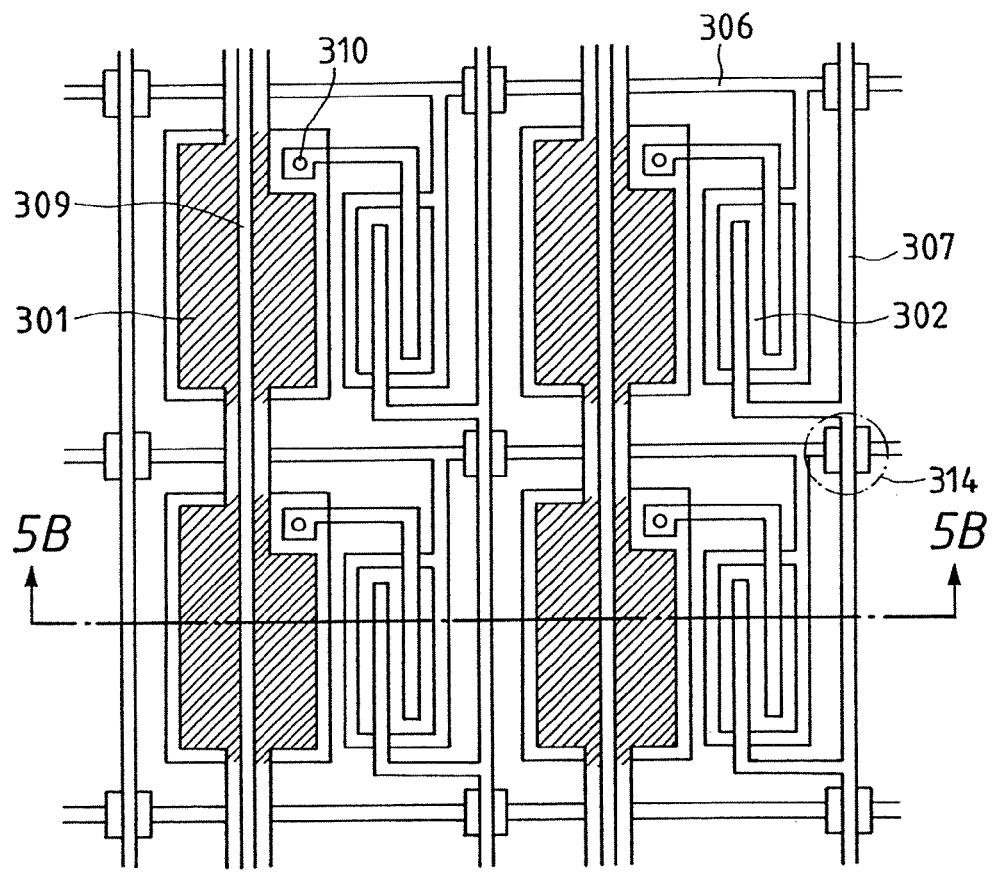
FIG. 5A is a schematic top plan view for explaining an example of the photoelectric conversion element.
Figure 5B:
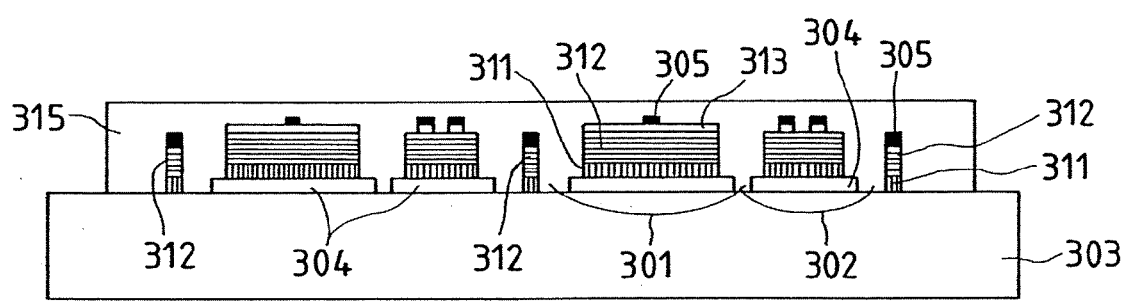
FIG. 5B is a schematic cross-sectional view for explaining an example of the photoelectric conversion element.

FIG. 5A is a schematic top plan view of the photoelectric conversion circuit section where the photoelectric conversion elements and switching elements are made using the amorphous silicon semiconductor thin film, and FIG. 5B is a schematic cross-sectional structural view along 5A-5B in FIG. 5A. The photoelectric conversion elements 301 and switching elements 302 (amorphous silicon TFTs, which will be referred hereinafter simply as TFTs) are formed on a same substrate 303, a same first metal thin film layer 304 is used in common to the lower electrodes of the photoelectric conversion elements 301 and the lower electrodes (gate electrodes) of TFTs 302, and a same second metal thin film layer 305 is used in common to the upper electrodes of photoelectric conversion elements 301 and the upper electrodes (source electrodes and drain electrodes) of TFTs 302. In addition, the first and second metal thin film layers are also used in common to the gate driving wires 306 and matrix signal wires 307 in the photoelectric conversion circuit section. In FIG. 5A, the pixel number of 2×2, four pixels in total, are drawn. In FIG. 5A the hatching portions represent light receiving surfaces of the photoelectric conversion elements. Numeral 309 designates power-supply lines for giving a bias to the photoelectric conversion elements. Further, 310 denotes contact holes for connecting the photoelectric conversion elements 301 with TFTs 302.

Now, explained is the method for forming the photoelectric conversion circuit section in the present invention. First, chromium (Cr) is evaporated over the insulating substrate 303 by sputtering or by resistance heating to form the first metal thin film layer 304 approximately 500 Å thick, it is patterned by photolithography, and unnecessary areas are etched. This first metal thin film layer 304 becomes the lower electrodes of photoelectric conversion elements 301 and the gate electrodes of switching elements 302. Next, by CVD, a-SiNx (311), a-Si:H (312), and N$^+$ layer (313) are successively deposited in the thicknesses of 3000, 5000, and 1000 Å, respectively, in a same vacuum. These layers are insulating layer/photoelectric conversion semiconductor layer/hole injection preventing layer of the photoelectric conversion elements 301 and also become gate insulating film/semiconductor layer/ohmic contact layer of the switching elements 302 (TFTs). Further, they are also utilized as insulating layers at cross portions (314 in FIG. 5A) between the first metal thin film layer 304 and the second metal thin film layer 305. Without having to be limited to the above thicknesses, the film thicknesses of the respective layers are optimally designed depending upon the voltage in use as a photoelectric conversion apparatus, charge, quantity of incident light to the light receiving surfaces of photoelectric conversion elements, or the like. At least, a-SiNx is desirably 500 or more Å so as not to permit electrons and holes to pass and so as to well function as a gate insulating film of TFT 302. After deposition of each layer, the areas to become contact holes (see 310 in FIG. 5A) are subjected to dry etching by RIE or CDE or the like, and thereafter aluminum (Al) is deposited in the thickness of about 10000 Å as a second metal thin film layer 305 by sputtering or by resistance heating. Further, patterning is carried out by photolithography and unnecessary areas are etched. The second metal thin film layer becomes the upper electrodes of photoelectric conversion elements 301, the source and drain electrodes of switching TFTs 302, the other wires, and so on. The upper and lower metal thin film layers are connected to each other at the contact hole portions 310 at the same time as film formation of the second metal thin film layer 305. Further, for forming the channel portions of TFTs 302, parts between the source electrode and drain electrode are etched by RIE, and thereafter unnecessary a-SiNx layer, a-Si:H layer, and N+ layer are etched by RIE, thereby separating the elements from each other. This forms the photoelectric conversion elements 301, switching TFTs 302, other wires (306, 307, 309), and contact hole portions 310. Although the schematic cross-sectional view of FIG. 5B illustrates only two pixels, it is needless to mention that a number of pixels are formed on the insulating substrate 303 at the same time. Finally, in order to improve resistance to humidity, the elements and wires are coated with a passivation film (protection film) 315 of SiNx. As described above, the photoelectric conversion elements, switching TFTs, and wires are formed by the common first metal thin film layer, a-SiNx, a-Si:H, N+ layer, and second metal thin film layer each deposited at the same time and only etching of each layer.

Using the process with the main material of amorphous silicon semiconductor as described above, the photoelectric conversion elements, switching elements, gate driving wires, and matrix signal wires can be fabricated at the same time on the same substrate, thereby providing the large-area photoelectric conversion circuit section easily and cheaply.

In general, the amorphous silicon TFTs have lower mobility of electron as a material thereof than the switch elements of crystal silicon, and thus have extremely large ON resistance. For example, the ON resistance of TFT in the channel size (W/L): 50 μm/10 μm fabricated by the above process will be very large as 8 MΩ with application of the bias (Vgs) of 12 V. If the photoelectric conversion circuit section as shown in FIG. 5A and FIG. 5B is constructed at the pixel pitch 100 μm using this TFT, the capacitance components formed in the photoelectric conversion elements will be 2 to 3 (pF) and the time necessary for transfer from the photoelectric conversion elements to the matrix signal wires will be approximately 20 (μsec) as a time constant τ. For sufficient transfer, the time of several times the time constant τ is necessary. Supposing the time of 4τ is set, the pulse width of the driving gate pulse of TFT will be 80 (μsec).

If Cgs of one above TFT is about 0.05 (pF) and if the number of pixels in one row is 4000, the capacitance component formed in a single matrix signal wire is $4000 \times Cgs = 200$ (pF).

The ON resistance of the reset switch elements (RES1 to RES3) in the reading circuit section shown in FIG. 3 can be readily made in the range of about several hundred Ω and several kΩ if the reading circuit section is of IC (crystal silicon); and the time constant $\tau_R$ necessary for reset thereof is below 1 (μsec) as long as the resistance components of wires can be ignored. However, the passing line of the reset current in the reset operation flows via Cgs of TFT through the gate drive wire (G1, G2, or G3 in FIG. 1, for example). If the material for the gate drive wires is chromium and if the photoelectric conversion circuit section is constructed in the structure as shown in FIG. 5A and FIG. 5B, the resistance value of the wires is expected to be high. If the wire width is made wider in order to decrease the resistance value, the area occupied by the light receiving surface of the photoelectric conversion element against the pixel region of 100 (μm)×100 (μm) will decrease, which will result in failing to ensure sufficient signal quantities; if the film thickness of wire is made thicker, the coverage property of the protection film 315 will be lowered, which will degrade the reliability. Accordingly, the appropriate size on design is approximately the wire width 10 (μm) and the film thickness of wire 1000 (Å) or so.

When chromium is used for the gate drive wires, the sheet resistance thereof is approximately 2 Ω/□, and the wire length is 4000 (pixels)×100 (μm) in the above example, which is approximately 40 or more (cm), so that the resistance of wire can be even 80 (kΩ). In that case $\tau_R = 1$ (μsec) is not sufficient for the time necessary for resetting the capacitance of about 200 (pF) formed in the matrix signal wire. In actual reset operation, the circuit is a two-dimensional, distributed constant circuit and, though cannot be expressed simply by the CR time constant, the time of several times 200 (pF)×80 (kΩ)=16 (μsec) is necessitated for sufficient reset, thus necessitating the time nearly equal to the width 80 (μsec) of driving gate pulse.

If the reading circuit section (IC) to which the matrix signal wires for 4000 pixels are connected is composed of a single IC, the size of the IC will be very large and the yield of the IC itself will be lowered. Also, in the case of the single IC, it takes a very long time for serial reading of data for one row=4000 pixels. Therefore, the reading circuit section is divided into an appropriate number of segments: N segments, and the N segments are operated at the same time. For example, N is so set as to achieve serial conversion in the time (t1+t4), which is the sum of the transfer time (t1) from the photoelectric conversion elements to the matrix signal wires and the reset time (t4) of the matrix signal wires. In the case of the above example, the transfer time t1:80 (μsec)+the reset time t4:80 (μsec)=160 (μsec), and when the conversion rate for serial conversion (the pulse width:t3 of Sp of shift register 2) is 1.6 (μsec), N=20 reading circuit sections capable of accepting inputs of 100 pixels need to be prepared.

Speaking with this example, the time necessary for reading of one row was t1+t4+(t3×100)=320 (μsec), whereas in the present invention the time necessary for reading of one row is t3×100=160 (μsec), which means that the speed is substantially doubled.

If such high-speed operation is not required in use of the photoelectric conversion apparatus, the same reading speed as before can be used with setting off longer transfer time t1 and reset time t4, which enables more sufficient transfer and reset.

It is also easy to further shorten t3 in the reading circuit section than t3=1.6 (μsec) in the above example, with use of ordinary ICs of crystal silicon. In this case, since the time necessary for reading of one row is determined by ts+t4, there is no change in the reading speed, but the number (N) of ICs of the reading circuit sections can be decreased, whereby cheaper photoelectric conversion apparatus can be provided.

As having been described above, as compared with the operation time of transfer plus reading plus reset necessary and indispensable for reading scanning of each row in the conventional technology, the present invention enables reading scanning of each row to be performed substantially in the time of only reading, thereby greatly increasing the speed of reading of the photoelectric conversion apparatus.

Embodiment 2

Figure 6:
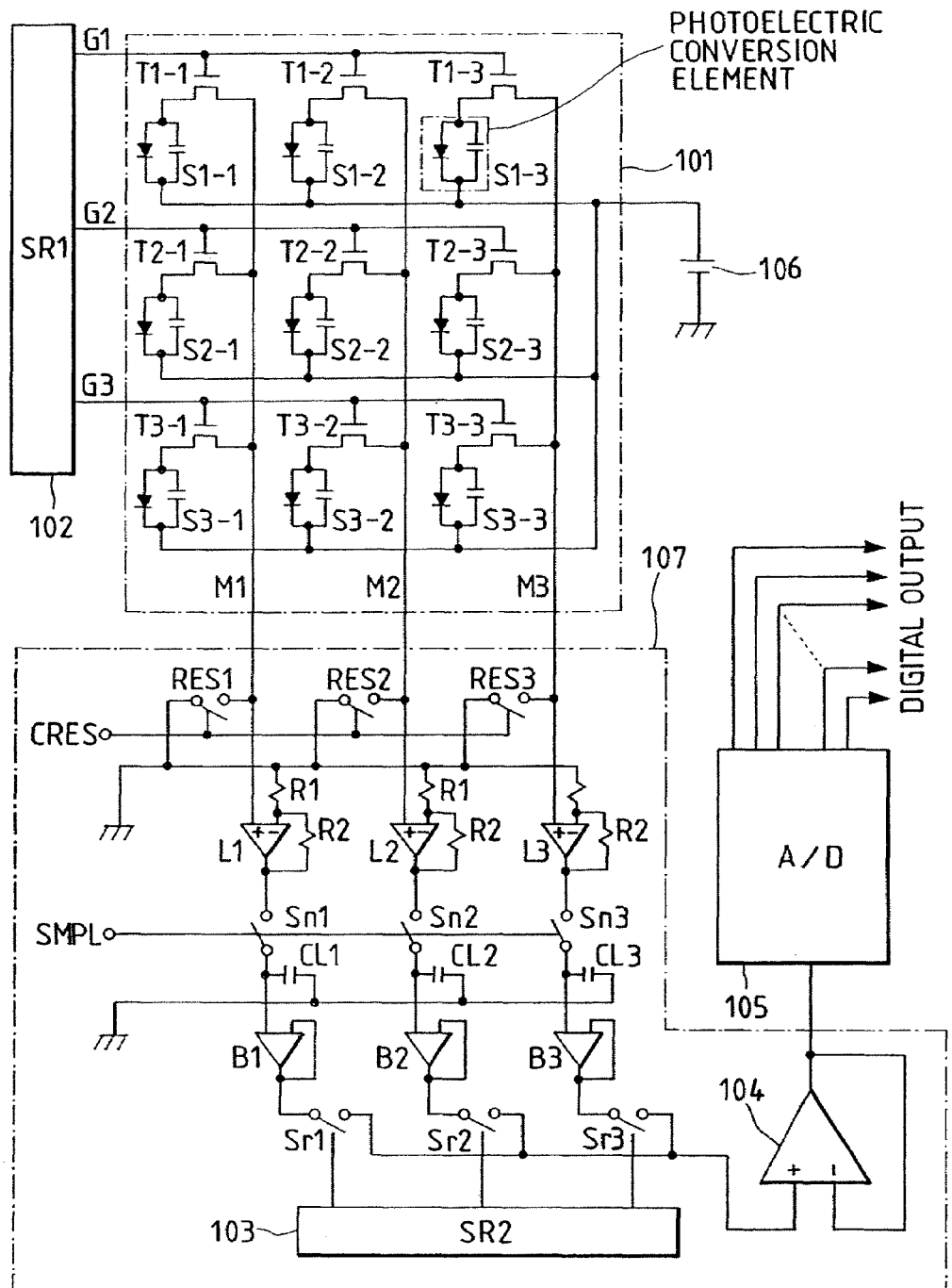
FIG. 6 is a schematic circuit diagram for explaining an example of the photoelectric conversion apparatus.

FIG. 6 is a circuit diagram of a photoelectric conversion apparatus to show the second embodiment of the present invention, which is an example where the photoelectric conversion circuit section is constructed of 3×3=9 pixels. The same constituent members as those in FIG. 3 showing Embodiment 1 are denoted by the same reference symbols and description thereof is omitted herein. FIG. 6 is different from FIG. 3 in that the buffer amplifiers L1 to L3 connected to the respective matrix signal wires in the reading circuit section are replaced by non-inverting amplifiers with an amplification factor G determined by resistors R1, R2. Further, though not shown in FIG. 6, the OP amps of the buffer amplifiers L1 to L3 are excellent in very low noise performance as compared with the other amplifiers. The amplification factor is 1+(R2/R1).

In general, the OP amps generate random voltage-nature noise, it is dominated by noise occurring in transistors incorporated, especially in first-stage transistors. For example, if the first-stage section is composed of a bipolar transistor, it is said that the thermal noise occurring in the base resistance determines the noise quantity of OP amp. The noise quantity is normally expressed against unit bandwidth, and the unit thereof is (Volt/$\sqrt{Hz}$). When the OP amps are used in the form of non-inverting amplifiers as shown in FIG. 6, the noise quantity is also multiplied by 1+(R2/R1) in accordance with the frequency band to operate. In the following description, the noise occurring in the OP amps will be considered to be a noise value before multiplied by the amplification factor, i.e., equivalent input noise voltage, which will be represented by Vn (V/$\sqrt{Hz}$).

In the present invention, Vn of OP amps (L1 to L3) shown in FIG. 6 is set below a certain selected value. The certain selected value is the noise value due to the so-called KTC noise occurring upon the transfer operation through the switching elements T1-1 to T3-3 in the photoelectric conversion circuit section 101. Namely, noise quantities occurring in the first-stage OP amp portions (L1 to L3) in the reading circuit section are set to be not more than the KTC noise quantity occurring in the photoelectric conversion circuit section 101. Either noise is intrinsic noise potentially occurring on principle, which cannot be made to be "zero" on design.

Next, with an example of the photoelectric conversion apparatus having 4000×4000=16 million pixels as also explained in the first embodiment, each noise will be roughly estimated. When the layers of a-SiNx, a-Si, and N+ are stacked in the thicknesses of 3000, 5000, and 1000 Å, respectively, and the pixel pitch is 100 μm, the capacitor (C1) in the photoelectric conversion elements S1-1 to S3-3 is about 3 pF and the reading capacitor (C2) of one of the matrix signal wires M1 to M3 is Cgs×4000=200 pF. The KTC noise (Tn) occurring upon performing the transfer operation by the switching elements (TFTs) T1-1 to T3-3 is as follows when obtained as voltage noise on the capacitance C2 of the matrix signal wire M1 to M3.

$$Tn=(K\times T\times(C1\|C2))^{1/2}/(C1+C2)$$

Here, K: the Boltzmann constant (1.38×10$^{-23}$(J/K)), T is an absolute temperature, and C1∥C2 is a series combined capacitance of C1 and C2.

This noise Tn statistic-probabilistically shows a Gaussian distribution and is expressed by an effective noise voltage value (Vrms). Calculating Tn at room temperature (300 K), Tn=0.55 (μVrms). On the other hand, the noise occurring in the OP amps L1 to L3 varies depending upon the handling frequency band B. As explained in the first embodiment, when the transfer time 80 (μs)+reset time 80 (μs), the OP amps receive input of signal of (1/160 (μs))=6.25 (kHz). Supposing the OP amps are operated in the frequency band B of four times that value, i.e., 25 (kHz), the photoelectric conversion signals transferred and the KTC noise occurring in the photoelectric conversion circuit section are amplified sufficiently (G times). In addition, the effective noise An (=Vn× $\sqrt{B}$) of the OP amp input portions occurring in the operation frequency band is also amplified G times. The noise An occurring in the OP amps and the KTC noise Tn in the photoelectric conversion circuit section 101 are independent from each other, and effective noise Jn at the amp input portion including the both noise is expressed by Jn=(An$^2$+Tn$^2$)$^{1/2}$ while the total effective noise at the amp output terminal is Jn×G.

Here, if An>>Tn, Jn is determined by An, which is disadvantageous in terms of S/N of the photoelectric conversion apparatus. Accordingly, desirably, An=Tn or An<Tn. When the frequency band B=25 (kHz) in the foregoing example, the equivalent input noise voltage Vn of OP amp is desirably 3.5 or less (nV/$\sqrt{Hz}$) from Tn≧(Vn×B$^{1/2}$) (=An). When Vn=3.5 (nV/$\sqrt{Hz}$), the effective noise of amp becomes equal to the KTC noise Tn, and the effective noise Jn of a combination of the two noises at the amp input portions becomes $\sqrt{2}$times Tn from Jn=(Vn$^2$+Tn$^2$)$^{1/2}$. Namely, Jn=0.55×$\sqrt{2}$=0.78 (μVrms) in the above example.

For obtaining images comparable to those by the conventional film method as applying the photoelectric conversion apparatus according to the present invention to the X-ray image pickup apparatus, it is said that the S/N ratios required for the apparatus are very high, normally S/N=10000 or more.

Here is first described an example wherein the photoelectric conversion apparatus with the two-dimensional array of photoelectric conversion elements is applied to the X-ray image pickup apparatus.

Figure 7:
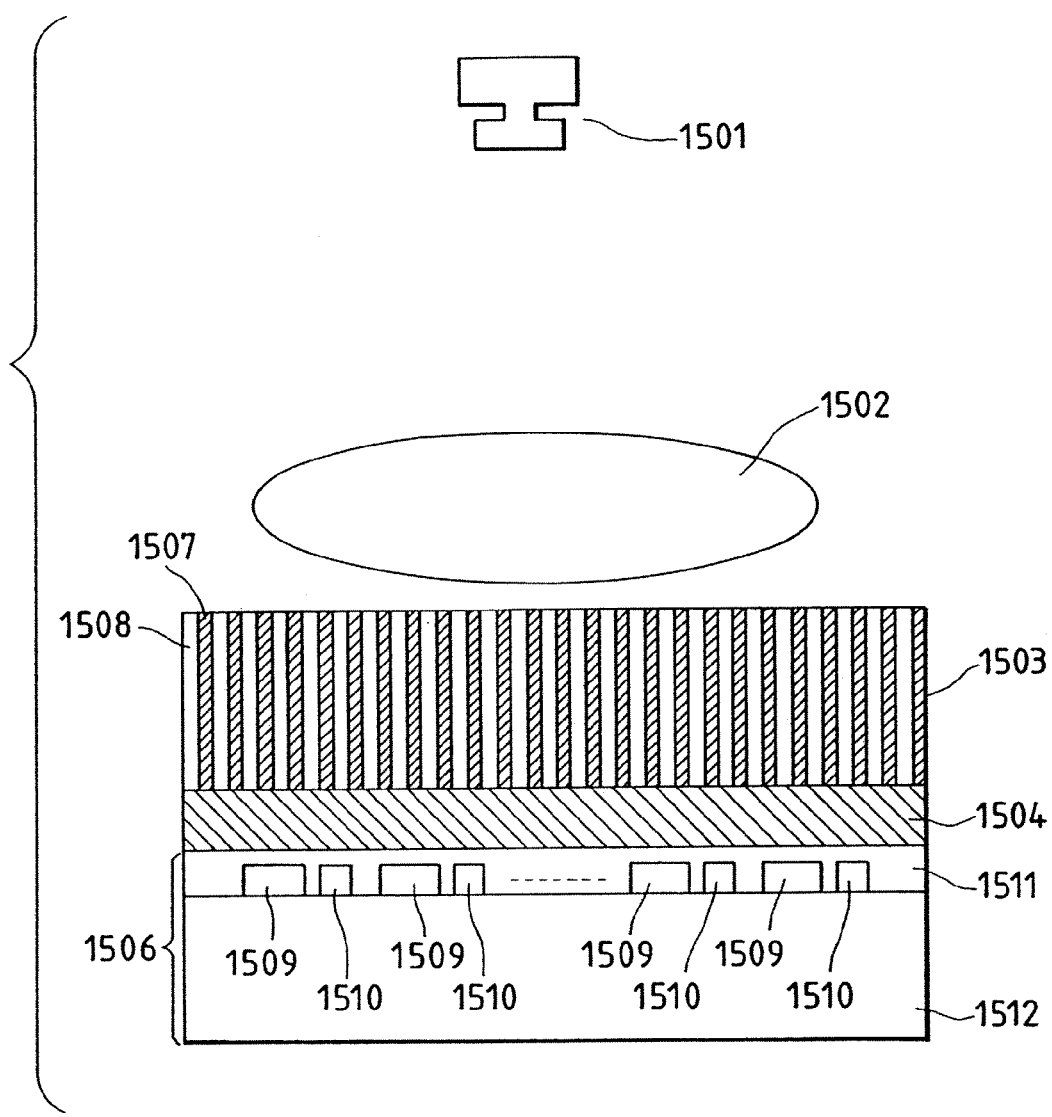
FIG. 7 is a schematic structural drawing for explaining an example of a device having the photoelectric conversion apparatus.

FIG. 7 is a schematic cross-sectional view of a medical X-ray detecting apparatus constructed using the two-dimensional photoelectric conversion apparatus. X-rays emitted from an X-ray source 1501 are radiated to a subject 1502 such as a human body (the affected part of patient or an examined part of an object), and X-rays associated with intracorporeal information about lung part, bone, focus, or the like or associated with internal information about a structure or an inner space travel toward a grid plate 1503. The grid plate 1503 is provided for the purpose to prevent the X-rays scattered in the subject from irradiating the fluorescent member 1504 and photoelectric conversion apparatus 1506, and is constructed of a substance 1507 for absorbing X-rays, such as lead, and a substance 1508 for transmitting X-rays, such as aluminum. The X-rays passing through the grid irradiate the X-ray-to-visible conversion fluorescent member 1504, being a wavelength conversion member, to be converted to wavelengths in the range including the sensitivity of photoelectric conversion element, for example, to visible light therein. Fluorescence from the X-ray-to-visible conversion fluorescent member is photoelectrically converted by the photoelectric conversion apparatus 1506. Here, 1509 denotes the photoelectric conversion elements, 1510 the switching elements, and 1511 a protection film for protecting the photoelectric conversion elements 1509 and switching elements 1510. Numeral 1512 designates an insulating substrate on which the photoelectric conversion elements 1509 and switching elements 1510 are placed.

Incidentally, when the X-ray-visible conversion fluorescent member is in close contact with the photoelectric conversion apparatus as shown in FIG. 7, the illuminance obtained on the light receiving surfaces of photoelectric conversion elements becomes maximum, and the illuminance at that time can be that of several (Lx) or so, though depending upon the fluorescent member used or a dose of the X-ray source. Photocurrent flowing in the photoelectric conversion elements with light of 1 (Lx) is about 5 (pA) per photoelectric conversion element in the foregoing example of the photoelectric conversion apparatus of 4000×4000; if the photocurrent is accumulated in the capacitor C1 of 3 (pF) in the photoelectric conversion element during the period of 500 (msec), the signal output S in the capacitor C2 of 200 (pF) of matrix signal wire after transfer through the switching TFT becomes 5 pF×500 msec/(3 pA+200 pA)=12.3 (mV). The noise value Jn in the capacitance C2 of 200 (pF) of matrix signal wire is Jn=0.78 ($\mu$Vrms), and regarding the effective noise Jn as N, the S/N ratio is 12.3 (mV)/0.78 ($\mu$V)=15800. Namely, the apparatus can fully function as a photoelectric conversion section of the X-ray image pickup apparatus.

The noise in the OP amp portion includes not only Vn, but also the thermal noise occurring in the resistance of R1, R2, for example. It can be easily reduced far smaller than the noise due to Vn by decreasing their resistance values. Also, there exists a current-nature noise component (In) in the input portion in the OP amps. This can be decreased to be far smaller than the noise due to Vn by using field-effect transistors for the first-stage transistors of the OP amps. Namely, since the equivalent input noise voltage Vn owned by the OP amps greatly affects S/N of the photoelectric conversion apparatus, Vn of OP amps is specified in the present invention.

Embodiment 3

Figure 8:
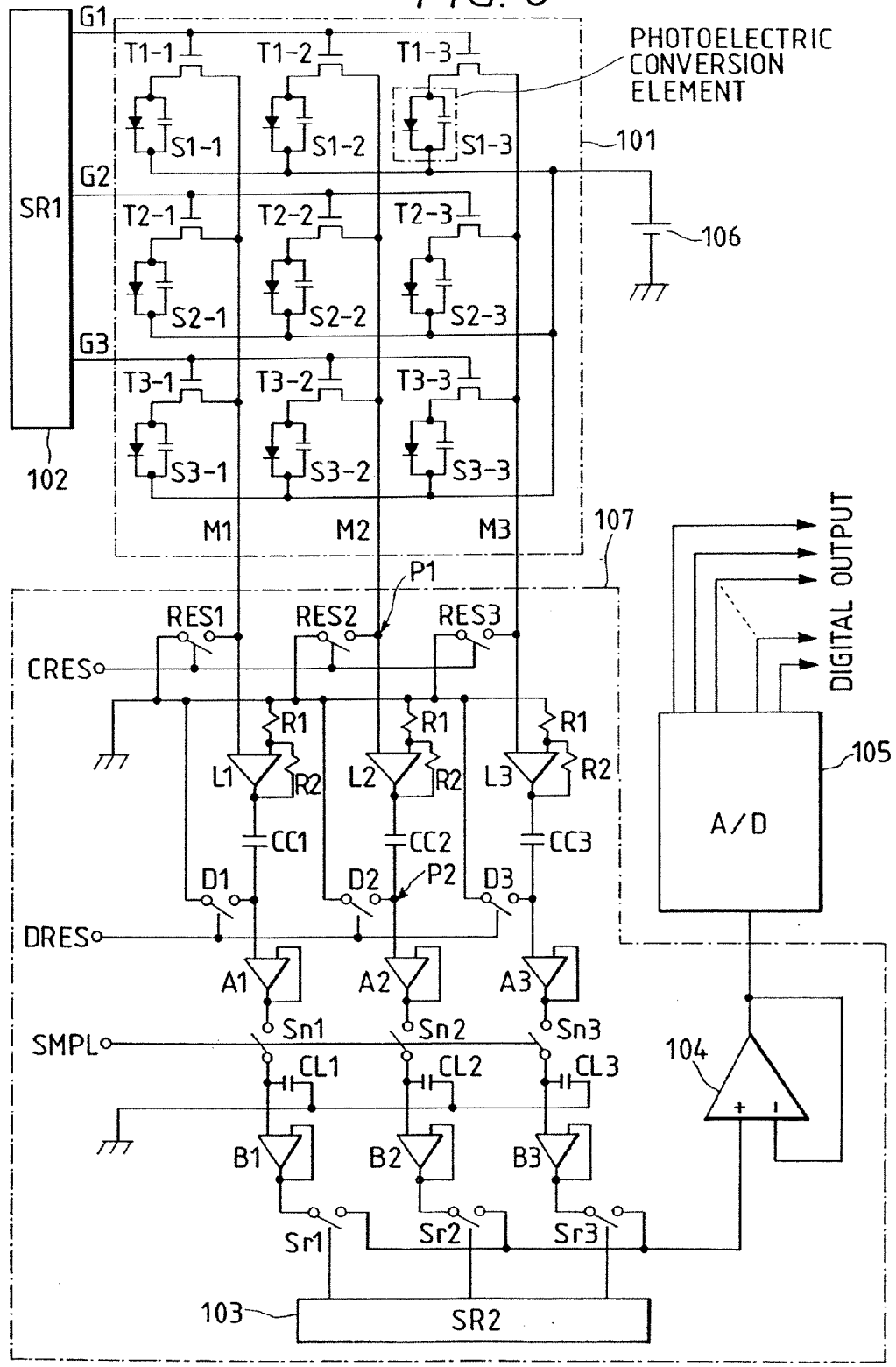
FIG. 8 is a schematic circuit diagram for explaining an example of the photoelectric conversion apparatus.

FIG. 8 is a circuit diagram of a photoelectric conversion apparatus to show the third embodiment of the present invention, which is an example in which the photoelectric conversion circuit section is constructed of 3×3=9 pixels. The same constituent members as those in FIG. 6 shown in the second embodiment are denoted by the same reference symbols and description thereof is omitted. FIG. 8 is different from FIG. 6 in that in the reading circuit section capacitor elements CC1 to CC3 for letting only AC components pass are connected to midway of output wires from the output terminals of OP amps L1 to L3 and in that reset switches D1 to D3 for DC restoration of the capacitor elements are provided. Further, a buffer amplifier A1 to A3 for impedance transformation is connected to each capacitor element CC1 to CC3.

Figure 9:
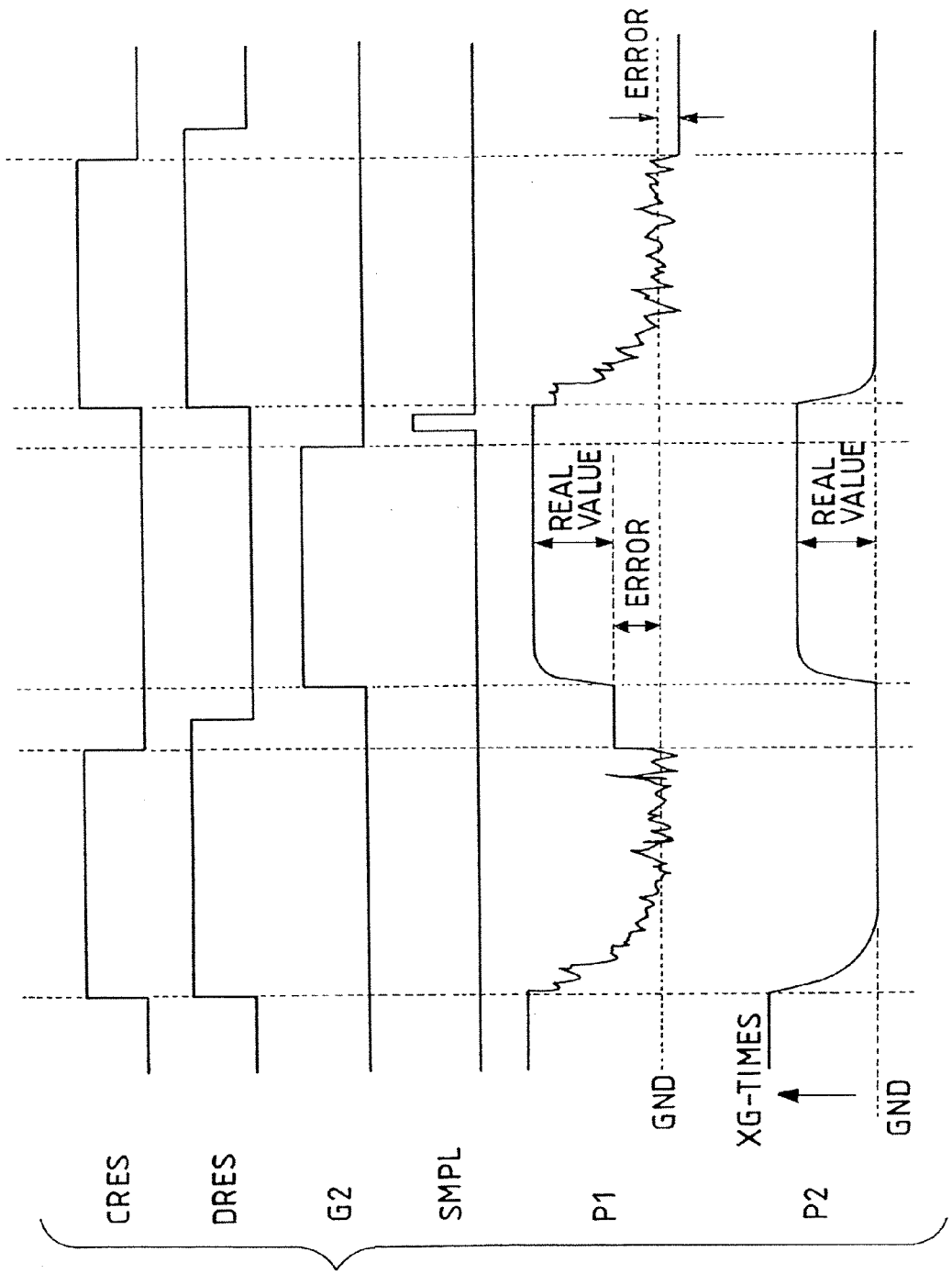
FIG. 9 is a timing chart for explaining an example of drive of the photoelectric conversion apparatus.

Also, FIG. 9 is a timing chart to show the operation in FIG. 8, which especially illustrates the operation related to the capacitor elements CC1 to CC3 and reset switches D1 to D3, and the other operation is the same as in FIG. 4. The operation of the present embodiment will be explained using FIG. 8 and FIG. 9.

CRES is a control signal of the switches RES1 to RES3 for resetting the capacitor CL (three Cgs of TFTs T1-1 to T3-3 which are not shown in FIG. 8) formed in the matrix signal wire M1 to M3 to the reset potential (GND). P1 shows states of change of potential at a node (for example, represented by P1 on FIG. 8) of matrix signal wire. Essentially, the node P1 should be reset to GND being the reset potential by the CRES signal "Hi." However, when the capacitor C2 of matrix signal wire is reset, the thermal noise probabilistically occurs as KTC noise because of the ON resistance of switch RES2. The noise quantity thereof. Rn=(KT/C2)$^{1/2}$ (Vrms). In the foregoing example of C2=200 pF, the noise reaches even Rn=4.55 ($\mu$Vrms), which will be the main factor of noise in the photoelectric conversion apparatus as exceeding foregoing Jn=0.78 ($\mu$Vrms).

If reading is carried out in the state wherein this noise quantity Rn is superimposed on the capacitor C2 of matrix signal wire, S/N of photoelectric conversion apparatus will be naturally lowered. In the waveform P1 of FIG. 9, deviation amounts (which are denoted by "error" in FIG. 9) from the reset potential GND after "OFF" of CRES are due to the KTC noise occurring upon this reset. This noise is also multiplied by the amplification factor G=1+(R2/R1) by the OP amp L1 to L3. Although not shown in FIG. 8, the output of G times the waveform P1 always appears in the output from the OP amp L1 to L3. P2 in FIG. 9 is a waveform of the opposed electrode of the capacitor element connected in series to the output of amp L2. Namely, it represents the waveform at node P2 shown in FIG. 8.

Here, the reset switch D2 is connected to the node P2 and is controlled by control signal DRES. DRES becomes "ON" nearly at the same time as CRES and DRES becomes "OFF" a little after "OFF" of CRES. During the period of "ON" of DRES the reset potential GND is given at the node P2. Even after DRES becomes "OFF" to change the switch element D2 into a high-impedance state, the node P2 is held at the GND potential. In that state, for example, when the gate (G2) of transfer TFT is turned "ON," the signal charge accumulated in the capacitance of photoelectric conversion element S2-2 is transferred to the capacitor C2 of matrix signal wire. Its state is shown in the waveform P1 of FIG. 9, and the KTC noise Rn upon reset, preliminarily held after end of CRES, is also superimposed upon the transfer operation. However, the waveform at the node P2 in this transfer operation process appears so that only the change of voltage of C2 due to the signal of photoelectric conversion element is multiplied by G, because the DC component of Rn multiplied by G in the OP amp L1 to L3 is shut off by the capacitor element CC2. Namely, it results in canceling the KTC noise upon reset. After that, the output of P2 is transferred to the capacitor element CL2 by the SMPL pulse, and then it is subjected to serial conversion by SR2 to be output from the OP amp 104. The operation of this part is the same as that explained in Embodiment 1.

As explained above, the present invention involves such an arrangement that in the reading circuit section 107 the capacitor elements CC1 to CC3 for letting only the AC components pass are connected to midway of the output wires from the output terminals of OP amps L1 to L3 and that the reset switches D1 to D3 for DC restoration of the capacitor elements are provided, whereby the KTC noise occurring upon reset of capacitance formed in each matrix signal wire can be removed, thus permitting enhancement of S/N of photoelectric conversion apparatus and permitting high-quality images to be obtained.

Embodiment 4

Figure 10:
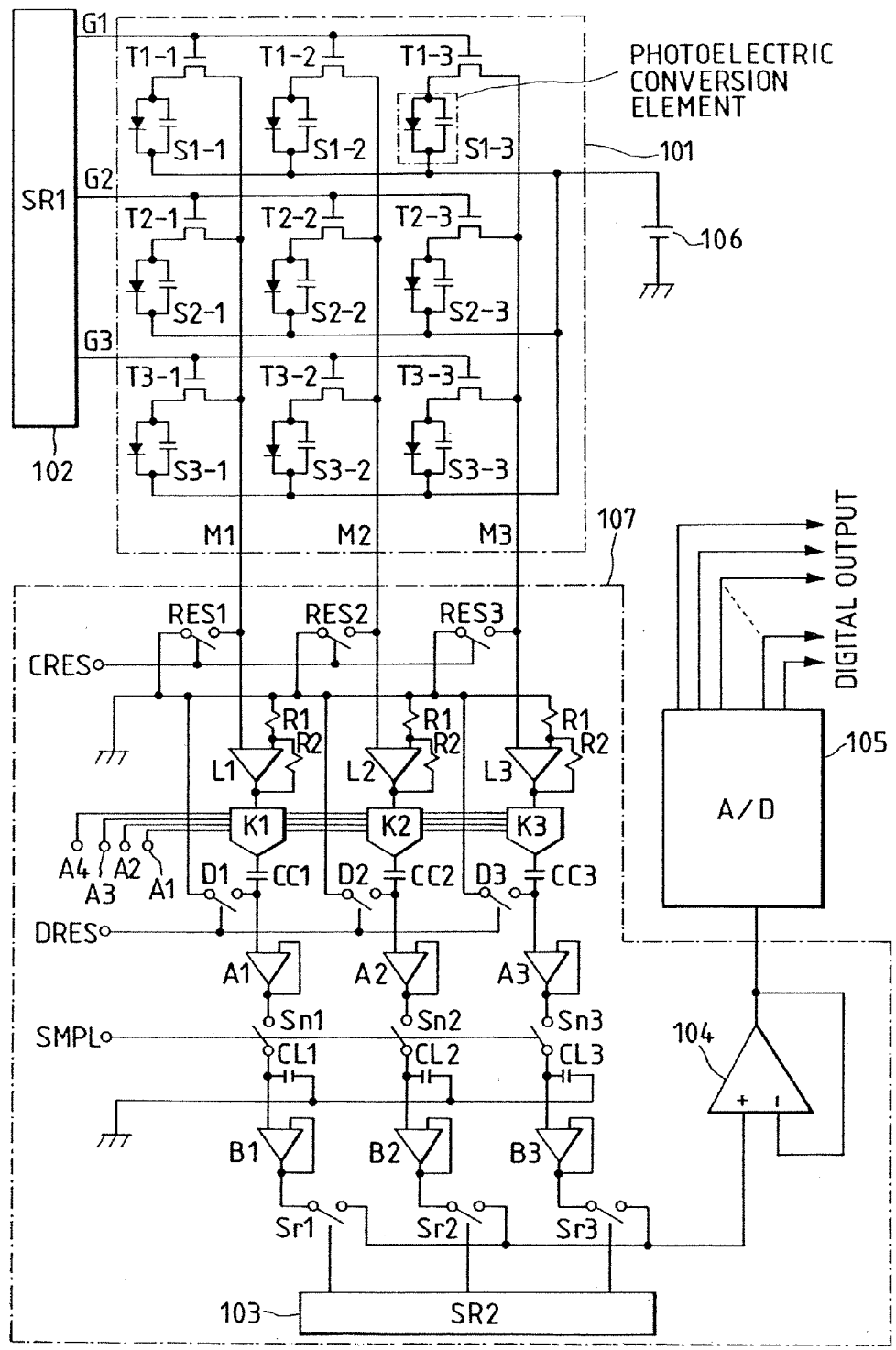
FIG. 10 is a schematic circuit diagram for explaining an example of the photoelectric conversion apparatus.
Figure 11:
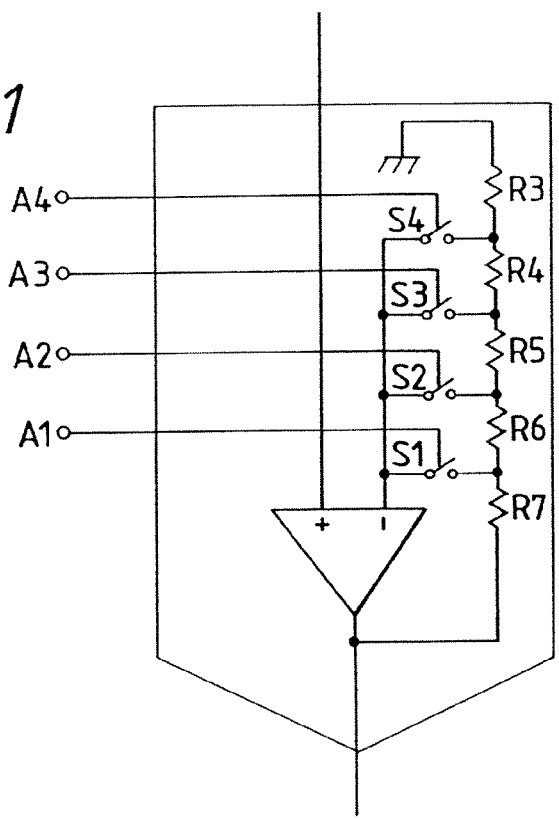
FIG. 11 is a schematic circuit diagram for explaining an example of the operational amplifier.

FIG. 10 is a circuit diagram of a photoelectric conversion apparatus to show the fourth embodiment of the present invention, which is an example in which the photoelectric conversion circuit section is constructed of 3×3=9 pixels. The same constituent members as those in FIG. 8 shown in the third embodiment are denoted by the same reference symbols, and description thereof is omitted. FIG. 10 is different from FIG. 8 in that in the reading circuit section 107 OP amps K1 to K3 having a function capable of variably controlling the amplification factor thereof by a signal from the outside are added. In FIG. 10 there are four signal lines A1 to A4 for controlling the amplification factor from the outside, thereby permitting selection of four amplification factors. FIG. 11 shows schematic circuitry inside of the amplification-factor-variable OP amp K1 to K3 in FIG. 10. The function will be explained briefly.

Terminals A1, A2, A3, A4 are those for inputting a signal for selecting an amplification factor from the outside, and only one of the four terminals is assumed to be "Hi." When the signal of "Hi" is input to either one of the terminals A1, A2, A3, A4, the switch element S1, S2, S3, S4 connected to either terminal A1, A2, A3, A4 is turned on. When either one switch is turned on, the OP amp K1 to K3 operates as a non-inverting amplifier. For example, if resistance values of resistors R3 to R7 are taken as sufficiently larger than the ON resistance of each switch element and if all are set to a same value R (Ω), the amplification factor with S1 on is 1+1/4=1.25×, the amplification factor with S2 on is 1+2/3=1.66×, the amplification factor with S3 on is 1+3/2=2.5×, and the amplification factor with S4 on is 1+4/1=5×. By properly selecting the resistance values of the resistors R3 to R7, other four desired amplification factors can be obtained.

The present embodiment showed an example of switching the four amplification factors by the four control signals, but without having to be limited to four, a desired number of control signals may be arranged to switch associated amplification factors. If a multiplexer circuit is connected to the control terminals, N external control signals permits switch of $2^N$ ways.

Overcoming the problem that individual differences of photoelectric conversion outputs occur due to dispersion on fabrication of a-Si semiconductor thin film as pointed out previously, the photoelectric conversion apparatus of the present invention can compensate for the output dispersion easily because of the function capable of controlling the amplification factor by a signal from the outside in the reading circuit section, and therefore, it has a merit of decrease in the cost of apparatus as a result.

Embodiment 5

Figure 12:
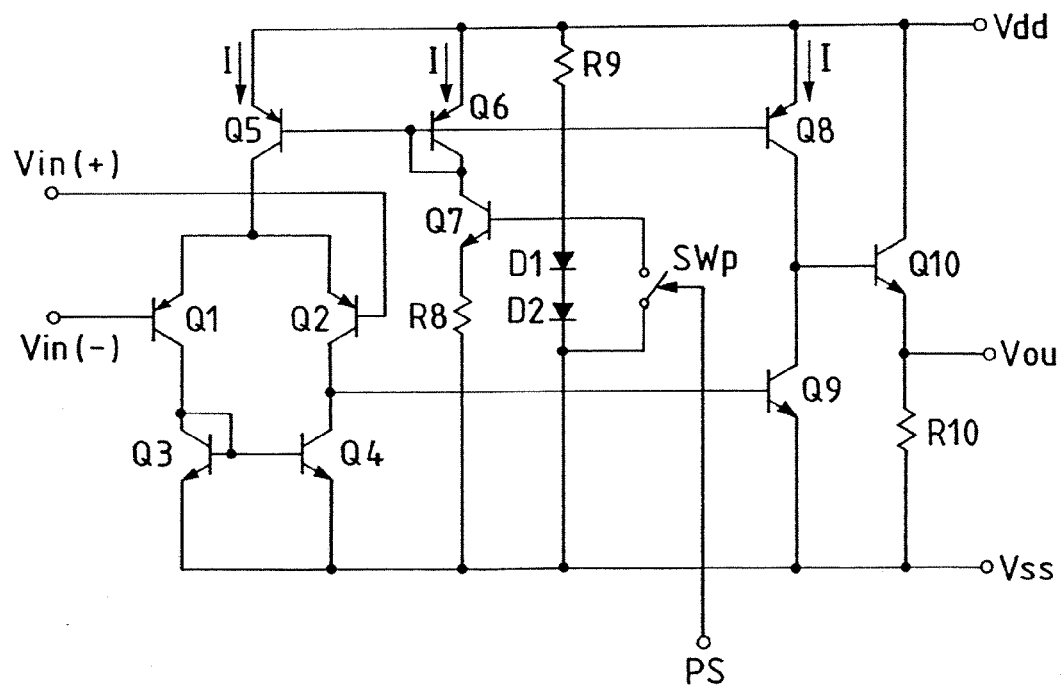
FIG. 12 is a schematic circuit diagram for explaining an example of the operational amplifier.

FIG. 12 is an example of a circuit diagram of one of OP amps incorporated in the reading circuit section of a photoelectric conversion apparatus according to the fifth embodiment of the present invention. In this figure the feature of the present invention resides in provision of a switch element SWp controlled by a signal from a terminal PS. Explanation of the operation concerning the function of this switch element SWp will be given.

Terminals Vdd, Vss are power terminals of the OP amp, and the power of Vdd>Vss is input. Normally, assuming that the GND of the system of photoelectric conversion apparatus is the zero potential, positive voltage is applied to Vdd while negative voltage to Vss, respectively. When a control signal from PS terminal is not input to the switch element SWp, that is, when SWp is "OFF," current flows through resistor R9, diode D1, and diode D2 to bias the base potential of transistor Q7 to the potential given by forward threshold voltage of D1, D2. Then the transistor Q7 turns into the "ON" state, the collector current I of transistors Q6, Q7 flows from Vdd terminal to resistor R8. Since Q6 and Q5, and, Q6 and Q8 are in the relation of current mirror structure, when the transistors of Q5, Q6, Q8 have the same performance, current equal to the collector current I of Q6 flows to the collectors of Q5, Q8. Q5 becomes a constant current supply for implementing the function as an OP amp. Bipolar transistors Q1, Q2 are input-stage transistors, current according to input difference voltage between input terminals VIN(+), VIN(−) flows into (or flows out of) the base of transistor Q9, and it is amplified in the output stage comprised of transistors Q8, Q9, Q10 to be output from the terminal Vout. Transistors Q3, Q4 compose current mirror structure to function as an active load on the input-stage transistors Q1, Q2. In practical use, it is used as a negative feedback circuit for effecting negative feedback from the output terminal Vout to the VIN(−) terminal of input terminal, a non-inverting amplifier circuit, or an impedance converting circuit, a voltage follower circuit, or the like. Also, it is often used as an inverting amplifier circuit.

Now, normally, when the OP amps are constructed using bipolar transistors as shown in FIG. 12, the power-supply current often exceeds 100 μA in common sense, though depending upon resistance values used. When several OP amps are connected to one matrix signal wire, as shown in FIG. 3, FIG. 6, FIG. 8, and FIG. 10, supposing the consumption current of 1 mA is necessary for reading one pixel and when the photoelectric conversion apparatus of 4000×4000 pixels is read, the power-supply current of 1 mA×4000 (columns)=4 (A) flows. Supposing the power-supply voltage of Vdd, Vss is +5 (V), −5 (V), respectively, the consumption power of 40 (W) is necessary in the reading circuit section. This power is always consumed as long as the power is input to each OP amp, even in the state where SR1, SR2, or the other switches, etc. do not operate in FIG. 3, FIG. 6, FIG. 8, or FIG. 10, that is, even in the non-reading state. This is converted to heat in the reading circuit section (IC), and the heat is radiated to the surroundings.

The switch element SWp shown in FIG. 12 is purposed to decrease the above consumption power during the periods except for reading. The operation will be described below. During the periods except for reading, a control signal from the terminal PS turns the switch element SWp "ON," thereby keeping no current flowing in the diodes of D1, D2. By doing so, the transistors Q6, Q7 become "OFF," so that no current flows. At the same time the collector current of transistors Q5, Q8 is also shut off. Namely, the control signal from the terminal PS causes the constant current supply in the OP amp to be shut off, which enables the consumption current to be reduced greatly. The switching element SWp may be, for example, an MOS transistor where it is switched by the voltage signal of 0 (V)/5 (V).

By providing the OP amps in the reading circuit section with such a switch for reducing the consumption current in the above manner as shown in FIG. 12, the temperature of the photoelectric conversion circuit section disposed around it can be prevented from increasing because of heat generation of the reading circuit section (IC), increase in the dark current "upon OFF" of TFTs of the switching elements can be decreased, and the fixed pattern noise of the photoelectric conversion apparatus can be decreased. Also, the decrease in the consumption power of the reading circuit section (IC) during the periods except for reading is of course economically advantageous.

Embodiment 6

Figure 13:
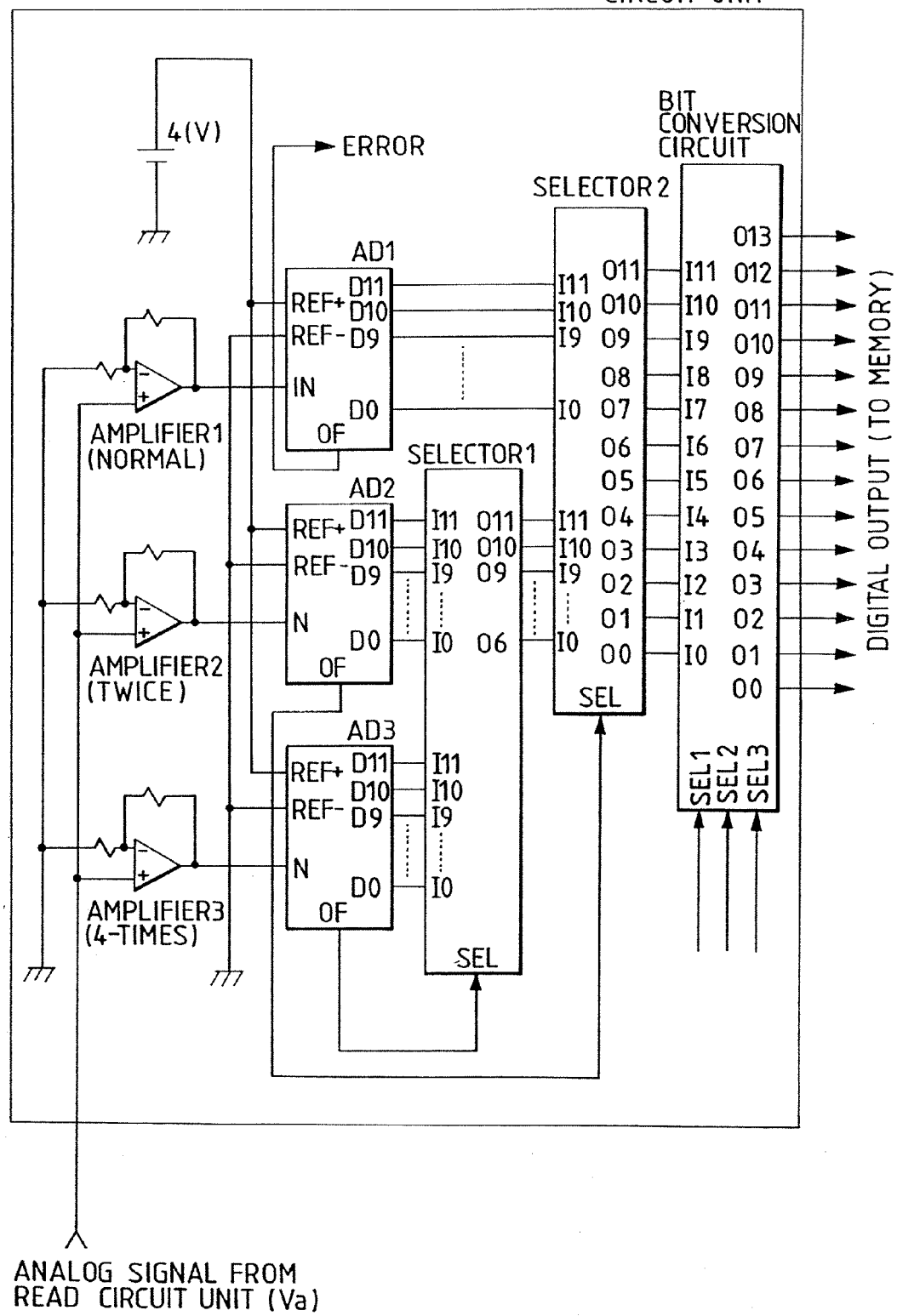
FIG. 13 is a schematic circuit diagram for explaining an example of the A/D conversion circuit.

FIG. 13 is a schematic circuit diagram of the A/D conversion circuit section of the photoelectric conversion apparatus, for explaining the sixth embodiment of the present invention. The A/D conversion circuit section of the present embodiment is composed mainly of three OP amps, three A/D converters, two selector circuits, and a bit converting circuit. The operation thereof will be explained.

The analog signal Va as serially converted in the reading circuit section is input into the three OP amps in the A/D conversion circuit section. The three OP amps will be referred to as amp 1, amp 2, and amp 3, and amplification factors G1, G2, G3 thereof are set in the ratio of 1:2:4. Each amplification factor is determined by a resistance value connected to the OP amp. In the present embodiment, for explanation's sake, the amplification factors G1, G2, G3 of amp 1, amp 2, and amp 3 are set to be ×1, ×2, and ×4, respectively. Also, the signal Va from the reading circuit section is assumed to be output in the range of 0 (V) to 1 (V). Namely, a signal over 1 (V) or a signal of minus voltage will never be input to the A/D conversion circuit section. The signal Va from the reading circuit section is amplified by amp 1, amp 2, and amp 3, and an output from each amp is input to the A/D converter AD1, AD2, AD3. Two reference voltages are supplied to terminal REF+ and to terminal REF− in the A/D converter AD1, AD2, AD3, and the analog input signal is digitized with respect to difference voltage between the reference terminals. The present embodiment employs 12-bit A/D converters. Namely, a signal is digitized in $2^{12}$=4096 steps. The two reference voltages of the A/D converters are set to 0 (V) and 4 (V).

Since AD3 is connected to the OP amp having the fourfold gain, A/D conversion is effected when Va is between 0 (V) inclusive and 0.25 (V) inclusive. When the signal Va is over 0.25 (V), overflow terminal OF outputs the logic signal of "Hi." Since AD2 is connected to the OP amp having the twofold gain, A/D conversion is effected when Va is between 0 (V) inclusive and 0.5 (V) inclusive. When Va is over 0.5 (V), the overflow terminal OF outputs the logic signal of "Hi." Since AD1 is connected to the OP amp having the onefold gain, A/D conversion is effected when Va is between 0 (V) inclusive and 1 (V) inclusive. When the signal Va is over 1 (V), the OF terminal of overflow terminal outputs the logic signal of "Hi."

Figure 14:
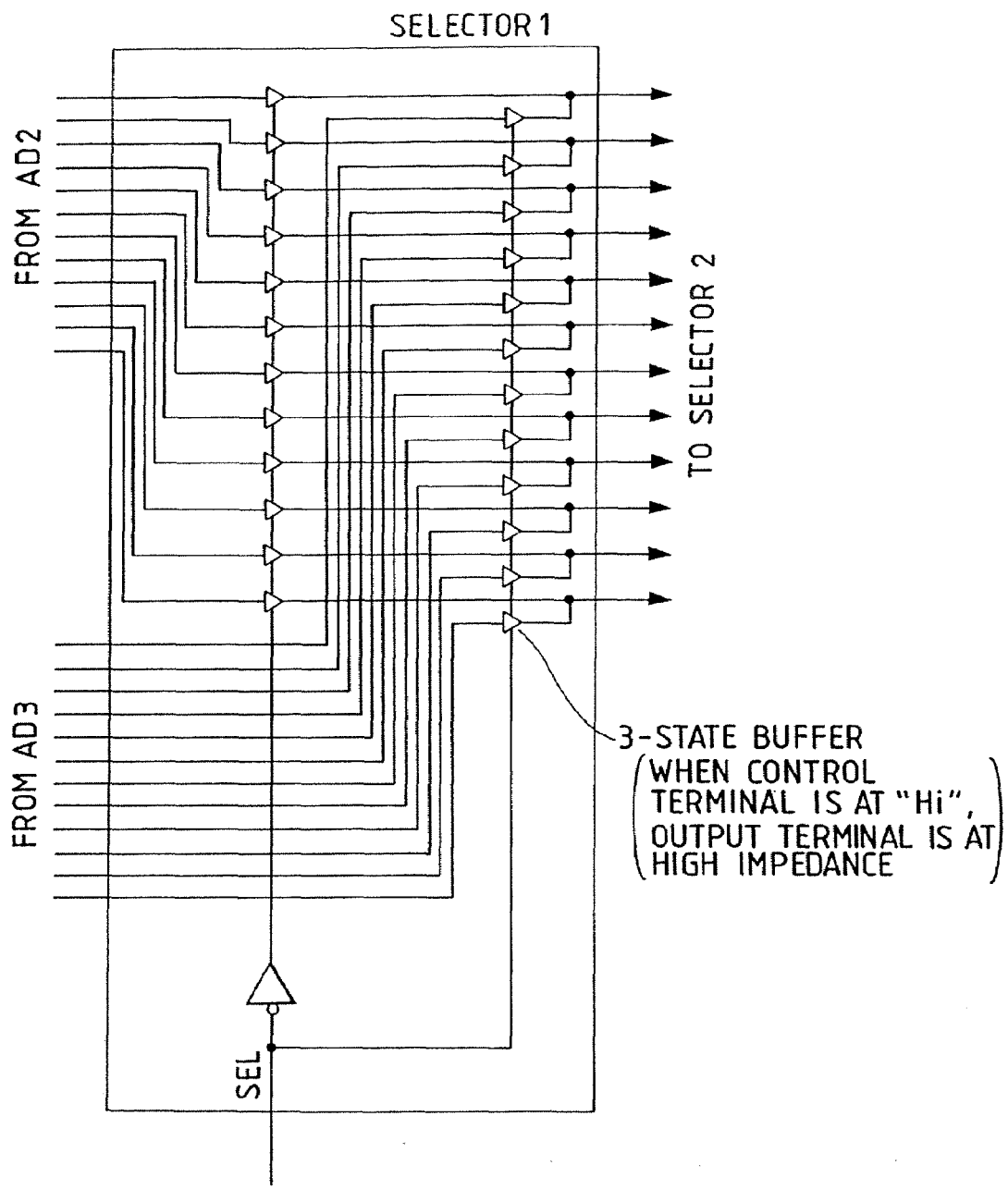
FIG. 14 is a schematic circuit diagram for explaining an example of a selector circuit section.

Also, selector 1 has such a function that when the digital signals from AD3 and AD2 are input thereto and if the OF terminal of AD3 is "Lo" then it outputs the digital signal from AD3 as it is but if the OF terminal of AD3 is "Hi" then it outputs the digital signal from AD2 as it is. Also, selector 2 has such a function that when the digital signals from selector 1 and AD1 are input thereto and if the OF terminal of AD2 is "Lo" then it outputs the digital signal from selector 1 as it is but if the OF terminal of AD2 is "Hi" then it outputs the digital signal from AD3 as it is. Namely, from the output terminal of selector 2, AD3 is output when Va: 0 (V) to 0.25 (V); AD2 is output when Va: 0.25 (V) to 0.5 (V); AD1 is output when Va: 0.5 (V) to 1 (V). The selector 1 and selector 2 are identical on a circuit basis, and FIG. 14 shows an example of schematic circuitry of selector 1 in FIG. 13.

When OF of each A/D converter is "Lo," that is, when the signal Va is smaller than 0.25 (V), a ratio of the digital outputs from AD1, AD2, AD3 becomes the gain ratio of amps G1:G2: G3=1:2:4. Namely, the digital output from AD2 is one obtained by shifting the digits of bits of the digital output from AD1 by one bit to the MSB side, and the digital output from AD3 is one obtained by shifting the digits of bits of the digital output from AD2 by one bit to the MSB side.

For example, when the output from AD1 is as follows from the MSB side

{000100101101}, the output from AD2 is

{001001011010}, and the output from AD3 is

{010010110100}.

Figure 15:
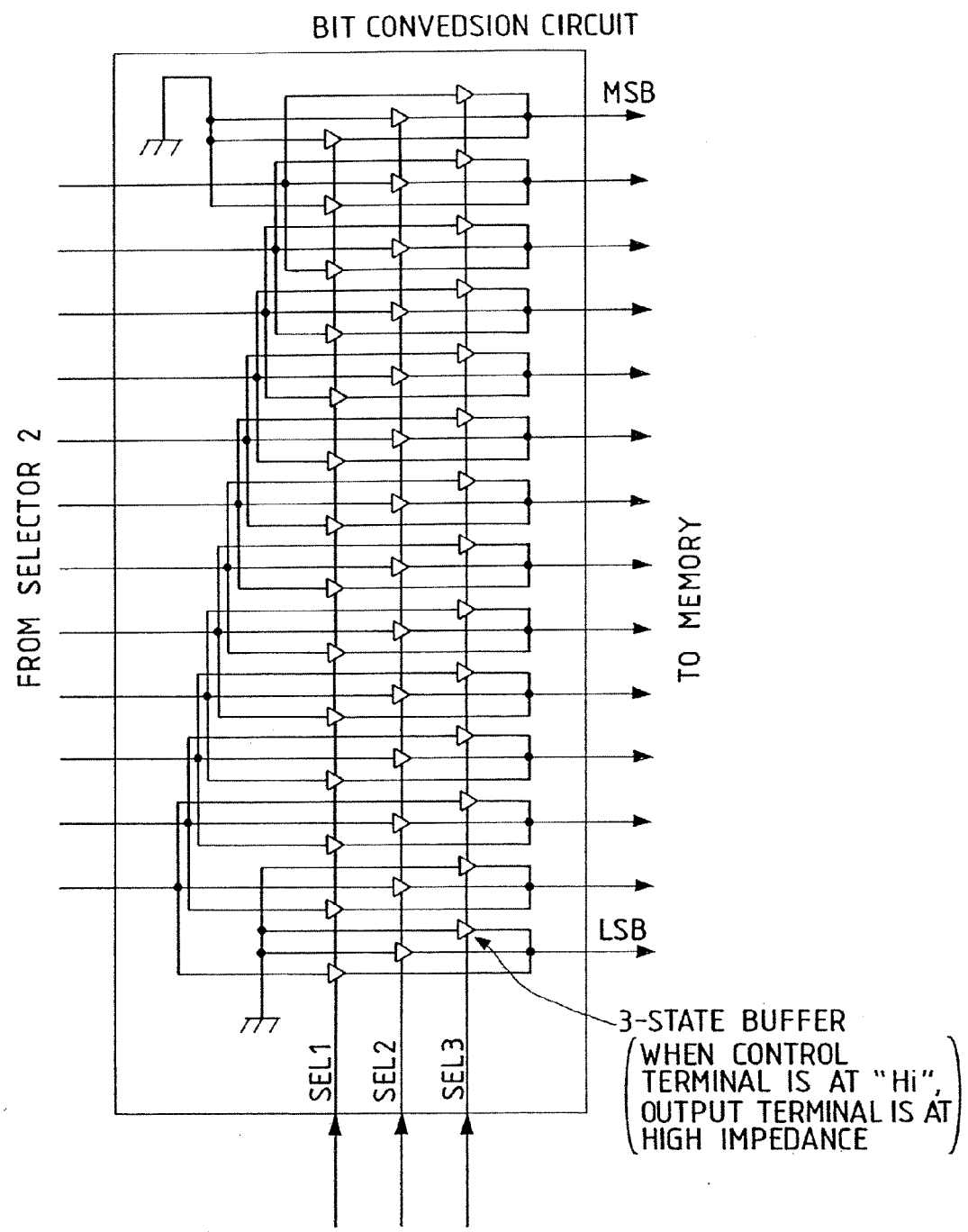
FIG. 15 is a schematic circuit diagram for explaining an example of a bit conversion circuit section.

FIG. 15 is an example of schematic circuitry of the bit conversion circuit in FIG. 13. In the bit conversion circuit, the 12-bit digital signal of selector 2 input thereto, i.e., the digital signal of the selected A/D converter, is converted to 14 bits. On that occasion the shift operation of bits corresponding to the selected A/D converter is carried out.

For example, if the A/D converter AD1 is selected and if the output thereof is as follows from the MSB side:

{10100100101101}, the 14-bit output from the bit conversion circuit is as follows

{1010010010110100};

if AD2 is selected and if the output thereof is as follows from the MSB side:

{100101001001}, the 14-bit output from the bit conversion circuit is as follows

{01001010010010};

if AD3 is selected and if the output thereof is as follows from the MSB side:

{101010111010}, the 14-bit output from the bit conversion circuit is as follows

{00101010111010}.

The desired bit shift operation is carried out according to the digital signal of selected A/D converter by an input signal of terminal SEL1, terminal SEL2, or terminal SEL3 of the bit conversion circuit section. That signal can be made by a simple logic circuit, using the signal from the OF terminal of each A/D converter. In FIG. 12, when terminal SEL1 is "Hi," bit conversion is carried out for the digital output from AD1; when terminal SEL2 is "Hi," bit conversion is carried out for the digital output from AD2; when terminal SEL3 is "Hi," bit conversion is carried out for the digital output from AD3.

As a result, the A/D conversion circuit section of the present embodiment is arranged so that AD3 performs digitization in $2^{12}$=4096 steps when Va: 0 (V) to 0.25 (V); AD2 performs digitation in $2^{11}$=2048 steps when Va: 0.25 (V) to 0.5 (V); AD1 performs digitization in $2^{11}$=2048 steps when Va: 0.5 (V) to 1 (V). Namely, it can cut the analog signal from the reading circuit section ranging from Va: 0 (V) to 1 (V) in 4096+2048+2048=8192 steps and can give an output as a 14-bit digital value. This 14-bit digital output is stored, for example, in a memory, and is subjected to digital processing with a computer.

In the present embodiment, signals with Va not more than 0.25 (V) are quantized in $1/2^{14}$ for the dynamic range: 1 (V). Namely, signals in low levels of ¼ or less are expressed in high resolution, and it is suitable, especially, for applications such as medical X-ray image pickup apparatus. Since offset components such as the fixed pattern noise (FPN) in the dark state caused in the photoelectric conversion circuit section and FPN caused in the reading circuit are digitized in high resolution, the accuracy of correction is improved in execution of offset correction.

The present embodiment was explained with the example wherein the A/D conversion circuit section included three OP amps and three A/D converters, but it may be provided with a plurality of respective elements (N elements). Also, the amplification factors of the OP amps were explained as ×1, ×2, and ×4, but they do not have to be G1:G2:G3=1:2:4 and may be set at another amplification factor ratio, for example, ×2, ×4, and ×8. In that case, the reference voltage of the A/D converters may be 8 (V) according to the amplification factors. With N OP amps, the ratio of gains of the respective OP amps may be set to $2^0:2^1:2^2:\ldots:2^{N-1}$, and N A/D converters are to be used. Further, the present embodiment employed the 12-bit A/D converters, but any-bit A/D converters may be used.

As seen from the above description, use of N OP amps and N M-bit A/D converters in the A/D conversion circuit section permits us to obtain digital outputs of (M+N−1) bits, and the data can be processed as digital values of (M+N−1) bits in a succeeding data processing apparatus using a computer and a memory circuit.

Also, analog signals of $1/2^{N-1}$ or less to the dynamic range can be converted to digital signals substantially in the same accuracy as in the case of using the A/D converters of (M+N−1) bits. This means that if the A/D converters of (M+N−1) bits do not exist or if they exist but cannot be used because of their conversion speed, (M+N−1) bit-equivalent digital conversion can be achieved by using N M-bit A/D converters.

Embodiment 7

Figure 16:
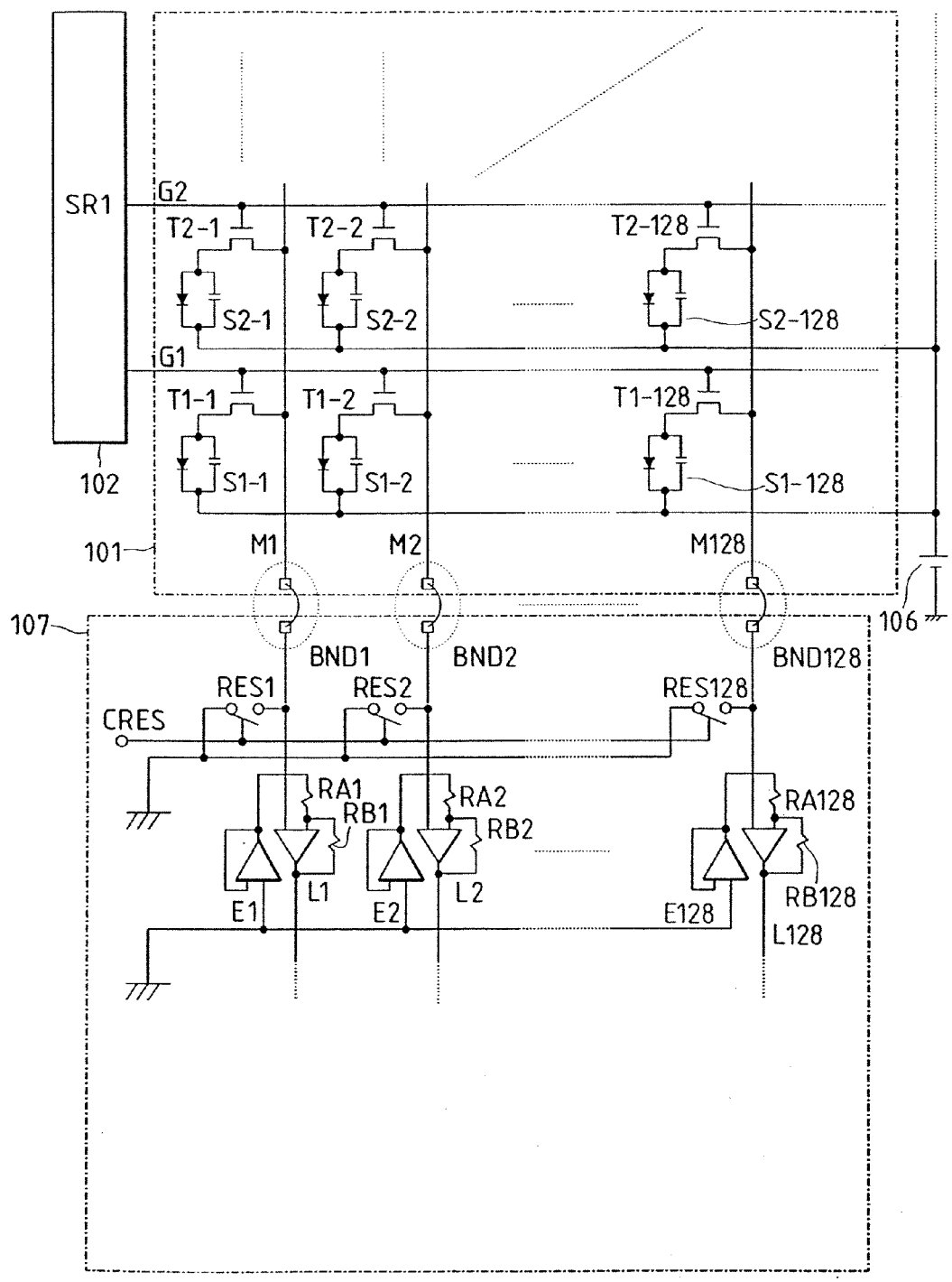
FIG. 16 is a schematic circuit diagram for explaining an example of the photoelectric conversion apparatus.

FIG. 16 is a circuit diagram of a photoelectric conversion apparatus showing the seventh embodiment of the present invention. In FIG. 16 the number of pixels of the photoelectric conversion circuit section 101 is not 3×3, but FIG. 16 illustrates an arrangement assuming a lot of pixels. Although the capacitor elements CL1 to CL3, switches Sn1 to Sn3, amplifiers B1 to B3, and switches Sr1 to Sr3 shown in the reading circuit section of FIG. 6 are not illustrated in FIG. 16, there actually exist 128 elements for each of them. It is also noted that the shift register 103, amplifier 104, and A/D conversion circuit section in FIG. 6 are not illustrated in FIG. 16, either.

In FIG. 16 the number of inputs to the reading circuit section 107 is 128 as illustrated. If the number of columns in the two-dimensional photoelectric conversion element circuit section 101 is, for example, 2560, twenty reading circuit sections 107 (ICs) will be used. BND1 to BND128 indicate interconnections between the matrix signal wires (M1 to M128) in the photoelectric conversion circuit section and the reading circuit section, which are connected by the wire bonding method or the anisotropic connection method.

FIG. 16 is different from FIG. 6 in that the potential (GND) to be a reference of the first-stage operational amplifier L1 to L128 for amplifying a signal from the matrix signal wire is supplied from buffer amplifier E1 to E128, respectively. As also described in Embodiment 2, the operational amplifiers L1 to L128 are purposed to amplify signals from the photoelectric conversion circuit section and are those having characteristics excellent in noise performance. At the same time, upon amplification by the operational amplifier, there also occurs the thermal noise at a resistor in the configuration as a non-inverting amplifier, in addition to the random noise occurring in the operational amplifiers of L1 to L128. Especially, the thermal noise (4KTRB) occurring at input resistor RA1 to RA128 interposed between the inverting terminal and GND of operational amplifier will result in being amplified by an amplification factor of non-inverting amplifier by the operational amplifiers of L1 to L128. Therefore, the input resistors of L1 to L128 need to be set small in order to keep the thermal noise occurring in the resistors smaller.

On the other hand, when a signal from the photoelectric conversion circuit section is input into the operational amplifier L1 to L128, an electric current according to a voltage of the input flows through the input resistor RA1 to RA128. For example, supposing the output voltage from the matrix signal wire M1, i.e., the input voltage of the operational amplifier L1 is V1, the electric current I1 flowing through the input resistor RA1 is given by I1=V1/RA1. Namely, as the input resistance becomes smaller, the thermal noise decreases, while the electric current flowing through the input resistor increases. The electric current will flow to GND. If the impedance of GND is large, the electric current flowing through the input resistor will cause a voltage drop. For example, in the case where GND is supplied at a single point from the outside to the reading circuit section 107, GND wiring is routed from that point to supply GND to the operational amplifiers of L1 to L128. In the case of the reading circuit section wherein the number of inputs is 128 as shown in FIG. 16, electric currents flowing in the 128 input resistors all flow into the GND wire, which would change the reference potentials (GND) of operational amplifiers existing away from the supply point of GND. In addition, amounts of the change will be dependent on input signals of the other signal wires, which could cause failure in obtaining correct photoelectric conversion signals. The voltage drop amount of reference potential can be decreased by increasing the line width of the GND wire thus routed, but it will also increase the chip area, which is not a desirable solution. Also, the impedance can be lowered by supplying GND from the outside to each operational amplifier of from L1 to L128, but it is not practical to provide lead-out pads in the same number as the number of inputs.

In the present embodiment, the operational amplifiers of L1 to L128 are provided each with the individual buffer amplifiers E1 to E128 to supply the reference potential (GND) for the low-noise amplifiers of L1 to L128 from the respective outputs of the buffer amplifiers of E1 to E128. As a result, even if the input resistors RA1 to RA128 of the operational amplifiers L1 to L128 are set small, so as to increase the electric currents flowing through the input resistors, a good-quality GND potential can be always supplied as the reference of the low-noise operational amplifiers L1 to L128, whereby accurate photoelectric conversion signals can be attained. Of course, the thermal noise occurring at the input resistors is low because of the small input resistances RA1 to RA128, so that S/N can be enhanced. Resistance values of the input resistors do not have to be too small and may be set in consideration of the thermal noise occurring at the resistors and the noise occurring at the buffer amplifiers E1 to E128.

The present embodiment was described with the number of inputs in the reading circuit section being 128, but the reading circuit section may include much more inputs without raising any problem.

Embodiment 8

Figure 17:
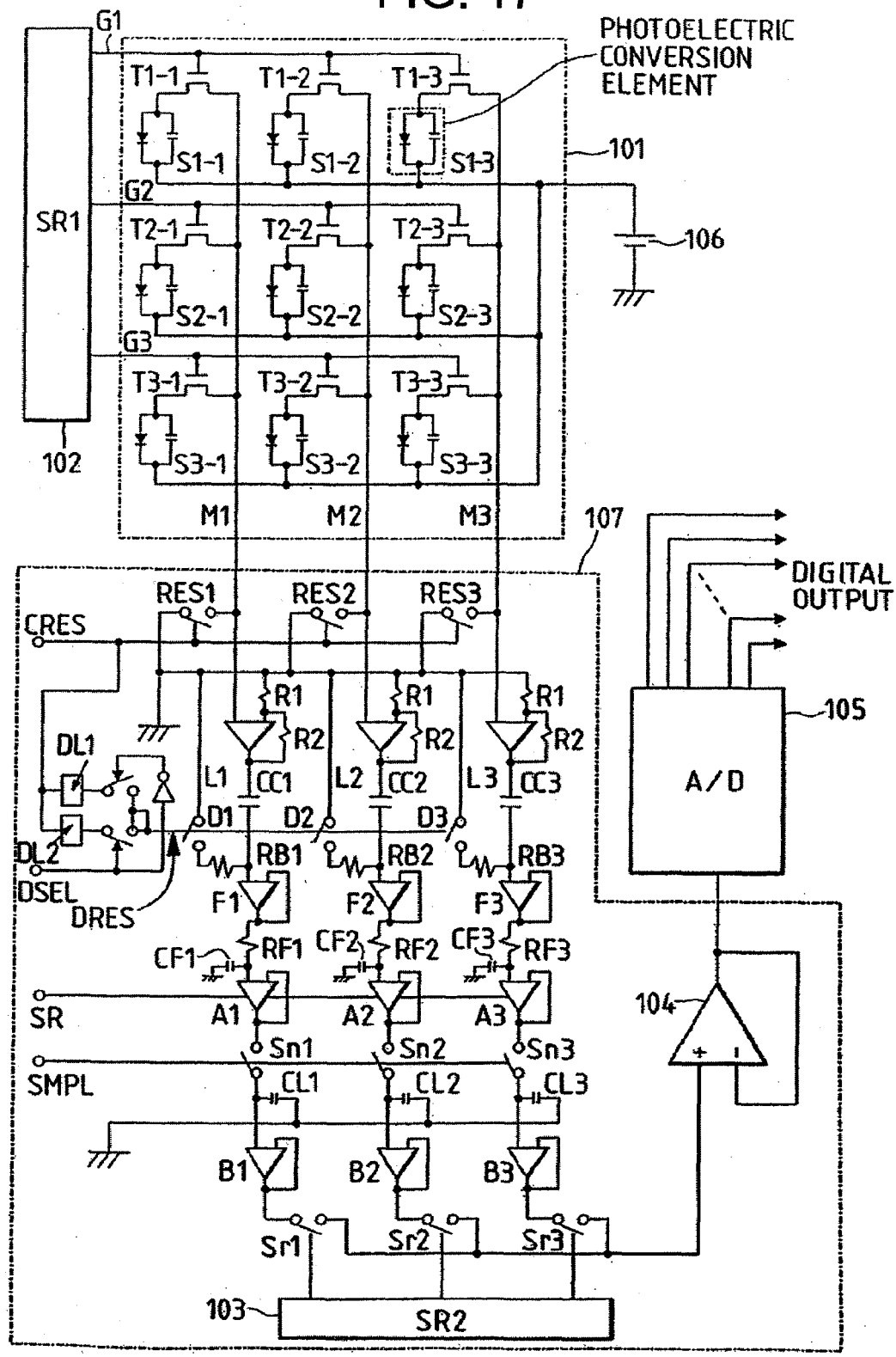
FIG. 17 is a schematic circuit diagram for explaining an example of the photoelectric conversion apparatus.

FIG. 17 is a circuit diagram of a photoelectric conversion apparatus for explaining the eighth embodiment of the present invention. The same members as those in FIG. 8 are denoted by the same reference symbols and description thereof will be omitted.

There are roughly the following four points in FIG. 17 different from FIG. 8. First, the capacitor elements CC1 to CC3 are connected through resistance elements RB1 to RB3 to the switch elements D1 to D3. Second, a signal for opening/closing the switch element D1 to D3, i.e., a DRES signal is made by CRES signal and delay circuit DL1 (or DL2) and, in addition, it can be selected by control signal DSEL from the outside. Third, a low-pass filter comprised of buffer amplifier F1 to F3, resistance element RF1 to RF3, and capacitor element CF1 to CF3 is provided between the capacitor element CC1 to CC3 and the buffer amplifier A1 to A3. Fourth, the slew rate of buffer amplifier A1 to A3 functioning in sampling a signal into the capacitor element CL1 to CL3 for sample and hold is arranged as capable of being varied by a control signal SR from the outside.

Although the photoelectric conversion apparatus of the present embodiment is illustrated with nine pixels of 3×3, the apparatus may be constructed with much more pixels without departing from the spirit of the invention. Since no inconvenience will occur with description about only one line of matrix signal wire, the present embodiment will be described with the drawing as to only the line of matrix signal wire of M1.

The operational amplifier L1 of first stage in the reading circuit section 107, for amplifying the signal from the photoelectric conversion circuit section 101, is excellent in low-noise performance, as also described in Embodiment 2. The frequency band thereof may be a band in which the photoelectric conversion signal transmitted by the transfer operation at TFT in the photoelectric conversion circuit section can be amplified enough. However, if the operational amplifier L1 has a frequency band broader than necessary, the photoelectric conversion signal can be amplified, while the high-frequency components of random noise occurring at L1 will be also amplified. The noise of high-frequency components appears in the output of the photoelectric conversion circuit section upon resetting it and results in being terminated at the capacitor element CC1. This will be a cause to degrade S/N. The high-frequency components of noise of L1 are also amplified in transfer of photoelectric conversion signal at TFT, which also degrades S/N. Namely, the performance required for the operational amplifier of L1 is the frequency band in which the amplifier can amplify the photoelectric conversion signal transmitted by the transfer operation at TFT in the photoelectric conversion circuit section enough and which is not broader than necessary. It is, however, not easy in actually designing and fabricating the operational amplifier to construct the operational amplifier having a desired band in a simple circuit configuration. Especially, in the case of the reading circuit of the present invention in which a plurality of operational amplifiers need to be made on a chip, there is a possibility of dispersion being not of one order of magnitude, but of several times. Therefore, the operational amplifier L1 is designed in a little broader frequency band, taking account of the dispersion, rather than the frequency band in which the photoelectric conversion signal transmitted by the transfer operation at TFT in the photoelectric conversion circuit section can be amplified.

Figure 18:
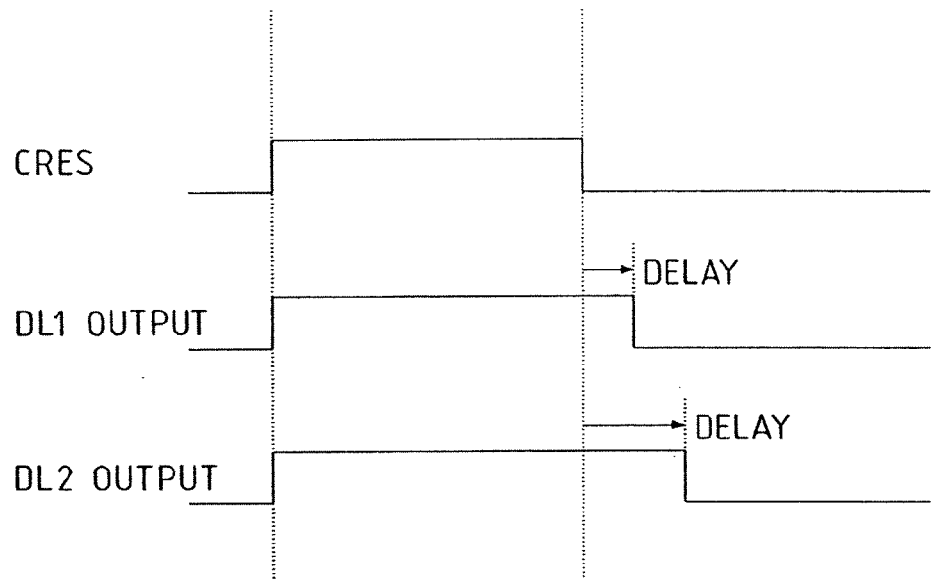
FIG. 18 is a timing chart for explaining an example of input/output to and from a delay circuit shown in FIG. 17.

FIG. 18 shows a timing chart of the CRES signal and DL1 output and DL2 output of delay circuit. The delay circuit DL1, DL2 is a circuit for effecting a delay only at a trailing edge of CRES signal and a delay amount of DL2 is greater than that of DL1. Thus, one can be selected from DRES signals of different delay amounts by a control signal from the outside. When the CRES signal is on, that is, upon reset of reading capacitance of matrix signal wire in the photoelectric conversion circuit section, the DRES signal is also on. The noise occurring at the operational amplifier L1 at that time is limited by the primary low-pass filter (LPF) having the cut-off frequency $fc=1/(2 \cdot \pi \cdot CC1 \cdot RB1)$ determined by the capacitor element CC1 and resistance RB1. Accordingly, even if the frequency band of operational amplifier L1 is set a little broader, insertion of resistance RB1 will virtually limit the frequency band, whereby the high-frequency-side noise of L1 can be cut.

During transfer of photoelectric conversion signal through TFT after end of reset, the buffer amplifier F1, capacitor element CF1, and resistance element RF1 function as a primary LPF. In other words, the high-frequency-side noise of L1 can be cut thereby. The band of buffer amplifier F1 can be set slightly high and the constants of CF1 and RF1 can be selected to be those achieving the frequency band in which the photoelectric conversion signal transmitted by the transfer operation at TFT in the photoelectric conversion circuit section can be amplified enough and which is not broader than necessary.

The delay time of trailing edge of DRES signal by the delay circuit DL1, DL2 is controlled by the DSEL signal. Let Td be a delay time of trailing edge of DRES signal. As described in Embodiment 3, the KTC noise, occurring in resetting the reading capacitance (C2) of matrix signal wire by CRES, can be canceled by coupling the capacitor element CC1 on an AC basis and effecting the timing operation shown in FIG. 6. With insertion of resistance element RB1, the quantity VKTC of the KTC noise clamped on CCL is given by $VKTC=VT(1-EXP(-Td/CC1 \cdot RB1))$ where VT is the total quantity of the KTC noise. Namely, the KTC noise can be accumulated sufficiently in CC1 by setting Td sufficiently longer than the time constant CC1·RB1 and the KTC noise can be canceled upon transfer of TFT. However, setting of longer Td will increase the time necessary for reading of one row, which in turn means that the reading time of photoelectric conversion signal for one frame becomes longer. For example, assuming that the photoelectric conversion apparatus of the present invention is applied to the X-ray image pickup apparatus, Td may be set longer for obtaining a high-quality still image of one shot, but in the case of obtaining a plurality of continuous moving pictures, the increase of reading time will decrease the acquisition rate (frame rate: the number of frames/sec) of moving picture. The present embodiment enables Td to be switched by the DSEL signal. This allows easy switching of the operation state by the DRES signal depending upon the purpose, for example, in such a way that the DRES signal with longer Td is used in the still image mode requiring the high quality of image with high S/N, whereas the DRES signal with shorter Td is used in the moving-picture mode of high frame rate.

When the shift register 103 in the reading circuit section is of a circuit system for performing synchronous output with basic clock, though not illustrated in FIG. 17, photoelectric conversion signals (analog signals) after serial conversion by 103 are output in synchronism with the basic clock. For example, when the basic clock is 10 MHz, the output rate of analog signal can also be designed at 10 MHz. However, there are cases to reject acceptance of the analog output rate of 10 MHz, for example, because of restrictions on hardware such as the A/D conversion circuit section 105 or the system circuit including the memory, CPU, and the other digital circuits provided thereafter, or because of software circumstances. In such cases, the operation may be performed at the basic clock, for example, of 5 MHz. In the present embodiment it is also possible to keep the delay amount Td constant at the operation timing to cancel the above KTC noise. It is realized by making the delay circuits DL1, DL2 with the basic clock, and they can be simple digital circuits.

For example, DL1 may be arranged to effect a delay of 16 clock pulses while DL2 a delay of 32 clock pulses. At 10 MHz DSEL is set to "Hi" to use DL2, achieving Td=3.2 (μsec); at 5 MHz DSEL is set to "Lo" to use DL1, achieving Td=3.2 (μsec). This means that Td can also be kept constant by switching of DSEL. The capacitance of CC1 and the resistance of RB1 can be properly set in consideration of the KTC noise, the band of operational amplifier L1, and the reading speed and the DRES signals can be switched by the DSEL signal, depending upon the purpose.

Figure 19:
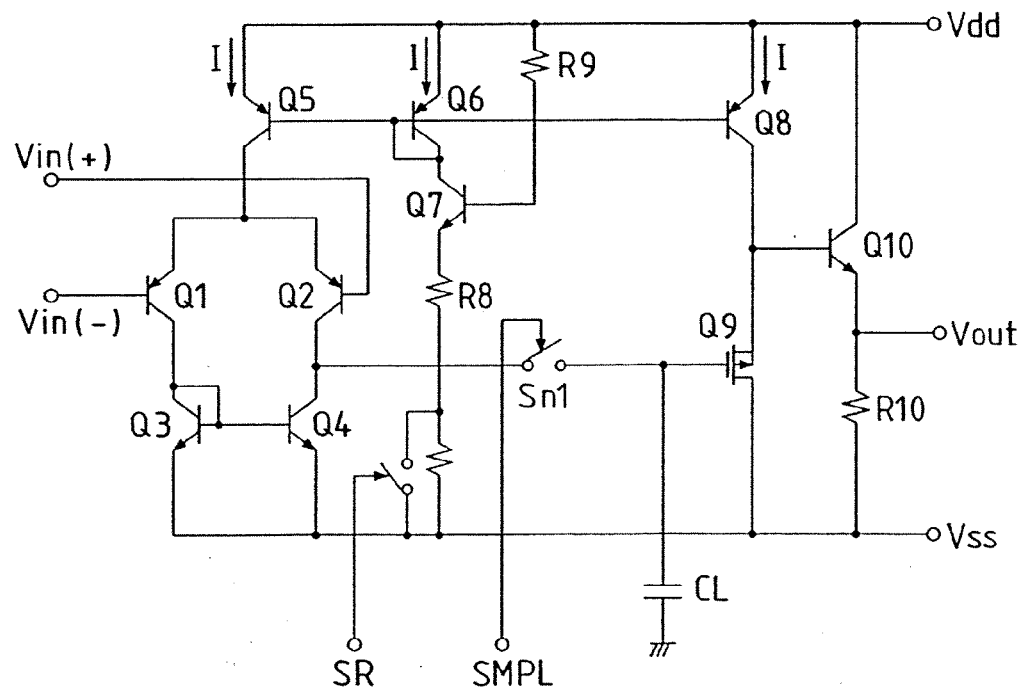
FIG. 19 is a schematic circuit diagram for explaining an example of a sample hold circuit.

FIG. 19 shows an example of a specific circuit configuration of the portion forming the sample hold section in FIG. 17, i.e., the region of buffer amplifier A1, switching element Sn1, capacitor element CL1, and buffer amplifier B1. Electric currents flowing in transistors Q6, Q5 can be varied between in an on state and in an off state of the external control signal SR. This changes an amount of charge that can be charged in CL in a unit time when the SMPL signal is on, that is, when the photoelectric conversion signal from the photoelectric conversion circuit section is sampled in the capacitor element CL. Namely, SR changes the slew rate (V/μsec) of amplifier A1. The noise occurring in the amplifier A1 is given by the reciprocal of gain of amplifier L1: 1/G (G:1+R2/R1) when converted at the input portion of the reading circuit section. Similarly as with L1 and the other amplifiers, it is dependent on the noise density (V/$\sqrt{Hz}$) and frequency band of A1. When the SR signal is turned to "Lo" at the amplifier of A1, the slew rate decreases. This means that the frequency band of amplifier A1 is decreased. This works advantageously in respect of S/N because the noise of amplifier A1 accumulated in CL can be decreased in sampling the photoelectric conversion signal with SMPL signal set "Hi." For example, when the signal from the photoelectric conversion circuit section is weak, SR is turned to "Lo" to decrease the slew rate of A1, whereby the noise can be decreased. For example, when the present photoelectric conversion apparatus is used as an X-ray image pickup apparatus, the X-ray dose is usually limited and signal amounts obtained become weak as described previously, which makes the switching function by SR effective.

Although in the present embodiment the switching by the control signal of DSEL or SR is described only by the switching function of two ways "Hi" and "Lo," it is of course easy to increase the number of switching ways, for example, four ways, eight ways, sixteen ways, . . . , with necessity.

Embodiment 9

Figure 20:
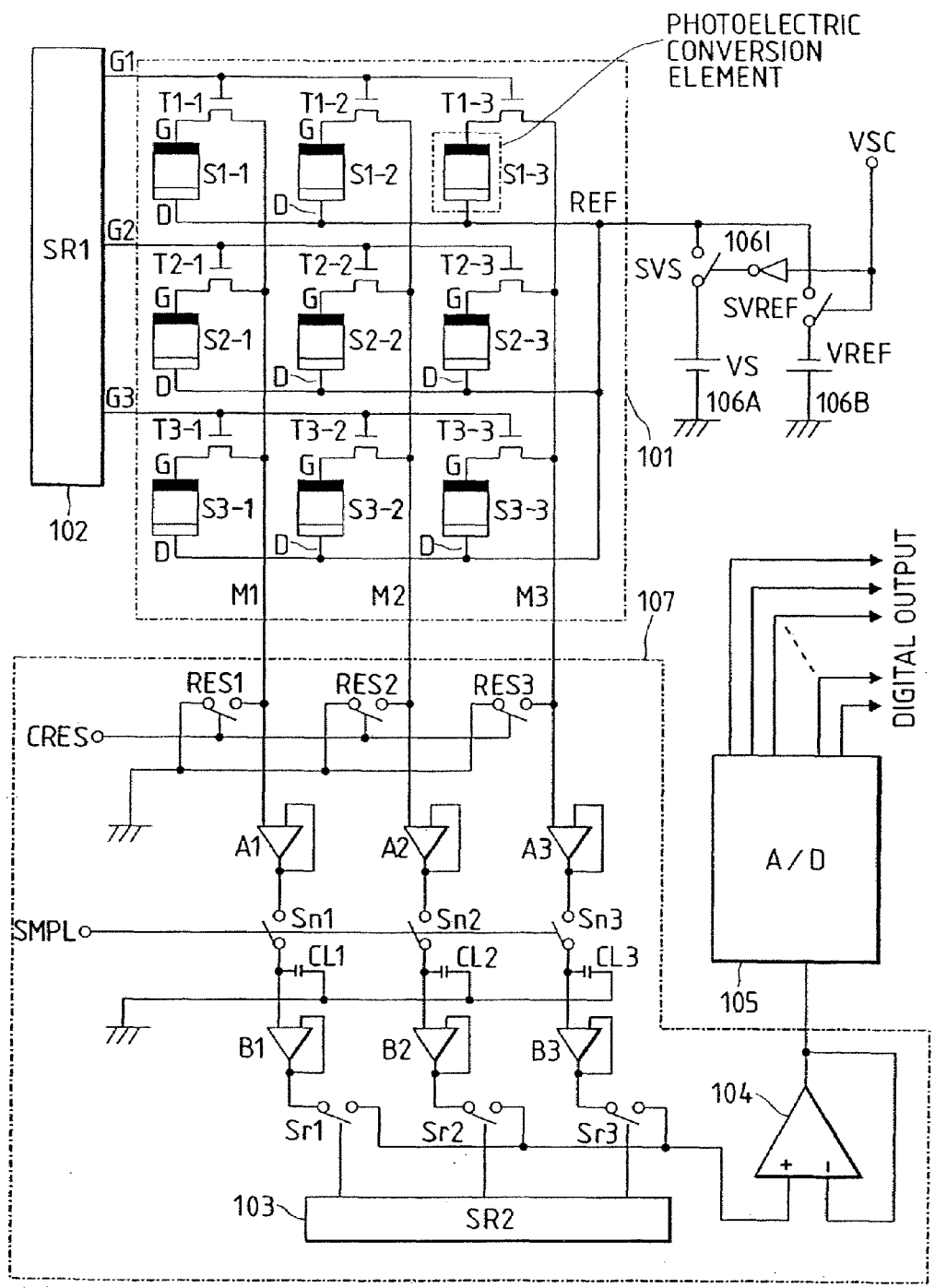
FIG. 20 is a schematic circuit diagram for explaining an example of the photoelectric conversion apparatus.

FIG. 20 is a schematic circuit diagram of a photoelectric conversion apparatus to show the ninth embodiment of the present invention. For simplicity of description only nine pixels of 3×3 are illustrated. FIG. 20 is different in the way of representing the photoelectric conversion elements S1-1 to S3-3 from FIG. 3. It is also different in the power-supply circuit section for supplying a bias to the photoelectric conversion elements. The reading circuit section is the same as in FIG. 3 and the same constituent members are denoted by the same reference symbols. The method for fabricating the photoelectric conversion circuit section is described in Embodiment 1. Accordingly, the schematic top plan view and the schematic cross-sectional view of photoelectric conversion element, switching element (TFT), etc. are the same as FIG. 5A and FIG. 5B, respectively. As seen from FIG. 5A and FIG. 5B, the photoelectric conversion elements have the same layer structure as the switching elements and are constructed as MIS capacitors. However, the $N^+$ layer is utilized as an upper electrode of photoelectric conversion element, different from the normal MIS capacitors, because of the necessity of incidence of light. Each photoelectric conversion element is also a capacitor element and a charge of photoelectrically converted signal will be accumulated in a capacitance of itself. Described in the present embodiment is a method of operation to perform accumulation of photoelectric conversion charge, transfer by TFT, and reading of signal after resetting of the photoelectric conversion elements also being capacitors with a bias circuit provided outside. The reset operation of photoelectric conversion element will be called "refresh." The photoelectric conversion elements S1-1 to S3-3 are illustrated in the different representation from FIG. 3, and the first metal thin-film layer in FIG. 5A and FIG. 5B will be called as "G" electrode of photoelectric conversion element, while the second metal thin-film layer thereof as "D" electrode. However, the D electrode functions as an electrode including the $N^+$ layer, as described above, for the photoelectric conversion elements S1-1 to S3-3.

Figure 22A:
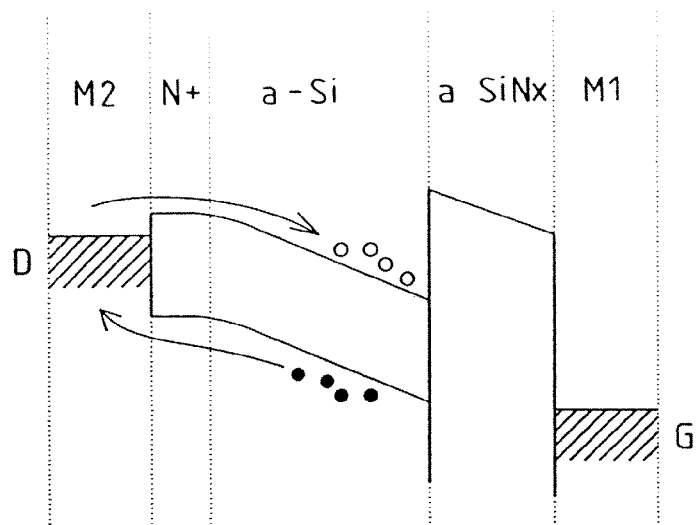
FIGS. 22A, 22B and 22C are schematic energy band diagrams for explaining an example of drive of photoelectric conversion element.
Figure 22B:
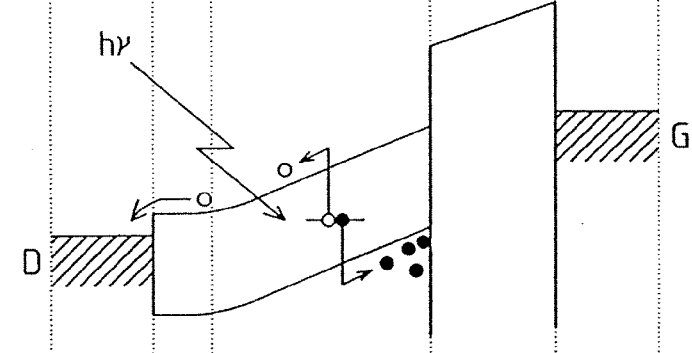
Figure 22C:
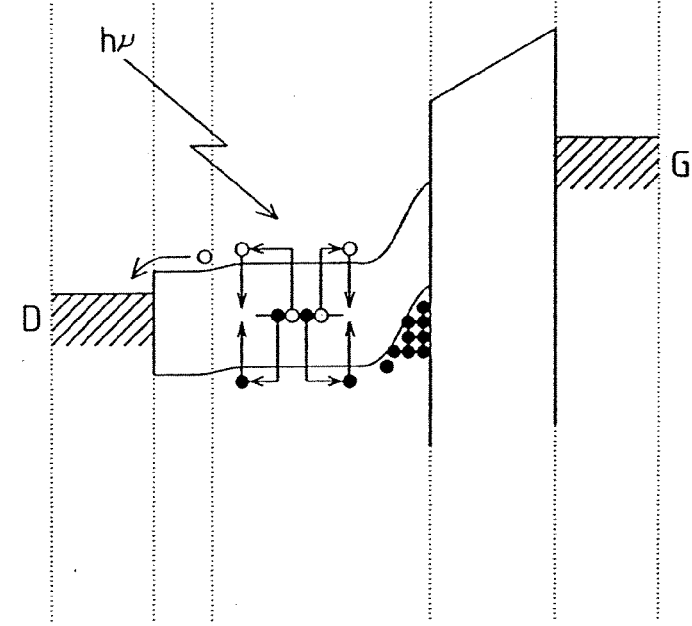

First, the device operation of single photoelectric conversion element will be described. FIG. 22A to FIG. 22C are energy band diagrams for explaining the device operation.

FIG. 22A and FIG. 22B show the operation in a refresh mode and the operation in a photoelectric conversion mode, respectively, of the present embodiment and show states in the thickwise direction of the respective layers of the photoelectric conversion element of FIG. 5A or FIG. 5B. M1 denotes the lower electrode (G electrode) made of the first metal thin-film layer (Cr). The a-SiNx layer is the insulating layer for preventing the both electrons and holes from passing therethrough and needs to have the thickness enough to prevent occurrence of tunnel effect, specifically set in 500 or more Å. A-Si is the photoelectric conversion semiconductor layer made of an intrinsic semiconductor i-layer. The $N^+$ layer is the injection preventing layer of N-type a-Si layer formed for preventing holes from being injected into the a-Si layer. Further, M2 is the upper electrode (D electrode) made of the second metal thin-film layer (Al).

In the present embodiment the D electrode does not cover the $N^+$ layer completely, but movement of electron is free between the D electrode and the $N^+$ layer. Thus, the D electrode and the $N^+$ layer are always at the same potential, which the following description assumes as a premise.

The present photoelectric conversion elements operate in two types of operation modes, which are the refresh mode and photoelectric conversion mode, depending upon how to apply the voltage to the D electrode and to the G electrode.

In FIG. 22A of the refresh mode, a negative potential is given to the D electrode with respect to the G electrode and the holes indicated by dots in the i-layer are guided to the D electrode by the electric field. At the same time, the electrons indicated by circles are injected into the i-layer. At this time, some holes and electrons are recombined in the $N^+$ layer and i-layer to annihilate. If this state continues for a sufficiently long time, the holes in the i-layer will be swept away from the i-layer.

For changing this state into FIG. 22B of the photoelectric conversion mode, a positive potential is given to the D electrode with respect to the G electrode. Then, the electrons in the i-layer are guided momentarily to the D electrode. However, since the $N^+$ layer serves as an injection preventing layer, the holes are not guided into the i-layer. If light is incident into the i-layer in this state, the light will be absorbed to generate electron-hole pairs. These electrons are guided to the D electrode by the electric field, while the holes migrate in the i-layer to reach the interface between the i-layer and the a-SiNx insulating layer. However, because they cannot move into the insulating layer, they remain in the i-layer. Since at this time the electrons move to the D electrode while the holes move to the interface to the insulating layer in the i-layer, an electric current flows from the G electrode in order to keep the electrically neutral state in the photoelectric conversion element. This electric current is according to the electron-hole pairs generated by the light and thus is proportional to the incident light. After the photoelectric conversion mode of FIG. 22B is maintained for a certain period and when the state is changed over again to the refresh mode of FIG. 22A, the holes having stayed in the i-layer are guided toward the D electrode as described above, so that an electric current according to the holes flows at the same time. The amount of the holes correspond to the total quantity of the incident light in the period of the photoelectric conversion mode. Although the electric current corresponding to the quantity of electrons injected into the i-layer also flows at this time, this quantity is almost constant and thus, detection can be done with subtraction of this quantity. Namely, the photoelectric conversion elements in the present embodiment can output the quantity of incident light in real time and can also detect the total quantity of incident light in a certain period.

However, if the period of the photoelectric conversion mode becomes longer or if the illuminance of the incident light is too strong for some reason, there would be some cases in which the electric current does not flow even with incidence of light. This is because many holes stay in the i-layer as shown in FIG. 22C, the holes weaken the electric field in the i-layer to stop guide of generated electrons, and the electrons are recombined with the holes in the i-layer. If the state of incidence of light is changed in this condition, an unstable electric current could flow. However, when the state is changed again to the refresh mode, the holes in the i-layer are swept away and an electric current proportional to light flows in the next photoelectric conversion mode.

In the foregoing description, when the holes in the i-layer are swept away in the refresh mode, the all holes are swept away ideally, but sweeping of part of the holes is also effective to obtain the electric current equal to that described above without any problem. This means that the element needs to be prevented from being in the state of FIG. 22C on the occasion of detection in the next photoelectric conversion mode and it is thus necessary to determine the potential of the D electrode relative to the G electrode in the refresh mode, the period of the refresh mode, and the characteristics of the injection preventing layer of the N$^+$ layer, satisfying it. Further, injection of electrons into the i-layer in the refresh mode is not a necessary condition, and the potential of the D electrode relative to the G electrode is not limited to negative values. The reason is as follows. If many holes stay in the i-layer and even if the potential of the D electrode relative to the G electrode is positive, the electric field in the i-layer will be applied in the direction to guide the holes to the D electrode. Similarly, as to the characteristics of the injection preventing layer of the N$^+$ layer, capability of injecting the electrons into the i-layer is not a necessary condition, either.

Figure 21:
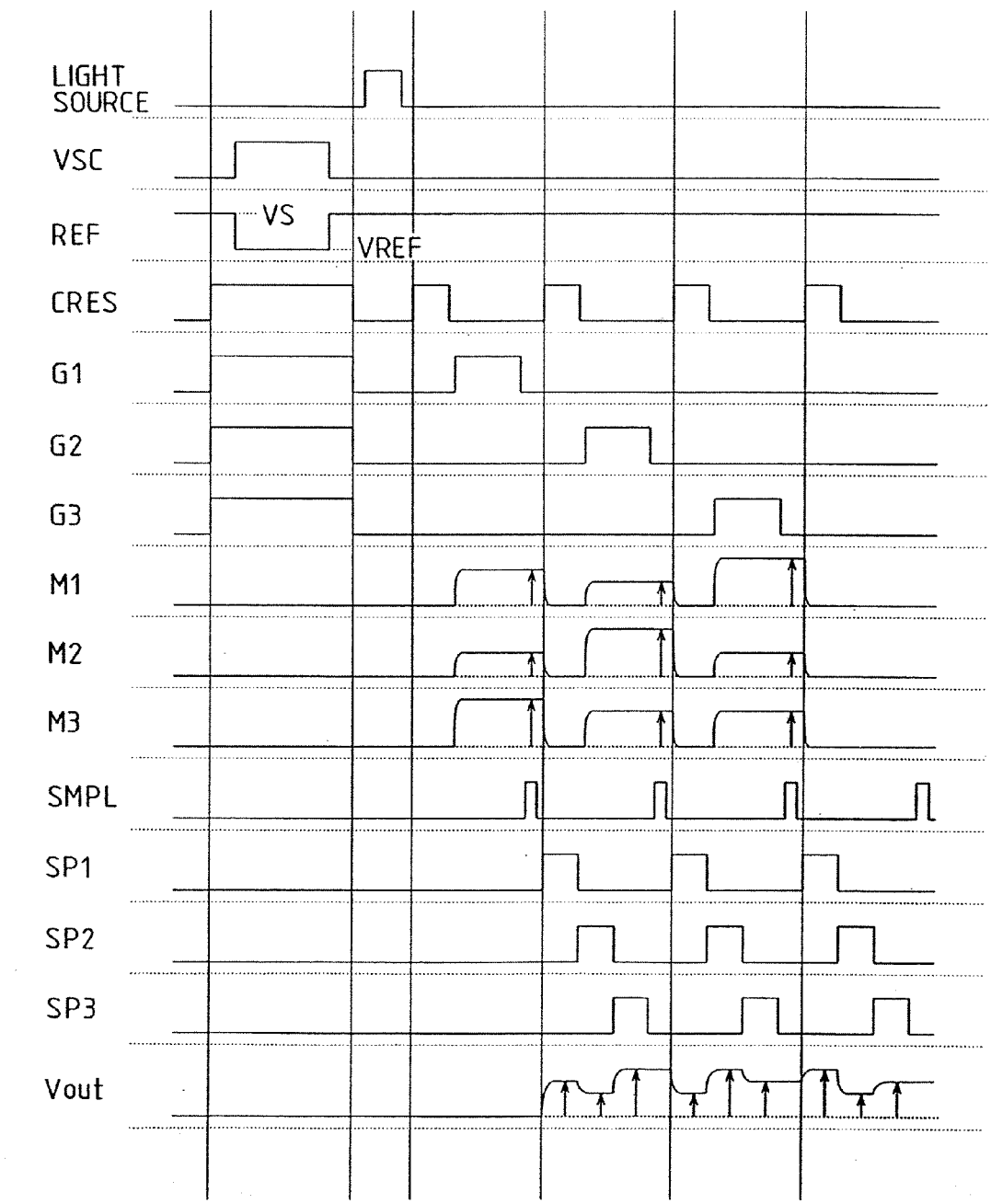
FIG. 21 is a timing chart for explaining an example of drive of the photoelectric conversion apparatus.

Next, an example of the operation of the photoelectric conversion apparatus of FIG. 20 will be described using the timing chart of FIG. 21. The control signal VSC is for giving two types of bias to the bias line REF of photoelectric conversion element, i.e., to the D electrode of photoelectric conversion element. The D electrode becomes VREF (V) when VSC is "Hi," but VS (V) when "Lo." 106A, 106B are DC power supplies, which are reading power supply VS (V) and refresh power supply VREF (V), respectively.

First, the operation in the refresh period is described. All signals from the shift register 102 are made "Hi" and the CRES signal of the reading circuit section is turned into the state of "Hi." Then the all TFTs (T1-1 to T3-3) for switching become conducted and the switch elements RES1 to RES3 in the reading circuit section also become conducted, thereby turning the G electrodes of the all photoelectric conversion elements to the GND potential. When the VSC signal becomes "Hi," the D electrodes of the all photoelectric conversion elements turn into a biased state (negative potential) to the refresh power supply VREF. Then the all photoelectric conversion elements S1-1 to S1-3 go into the refresh mode to be refreshed.

Next, the photoelectric conversion period will be described. VSC is switched to the state of "Lo" to turn the D electrodes of the all photoelectric conversion elements into a biased state (positive potential) to the reading power supply VS. Then the photoelectric conversion elements go into the photoelectric conversion mode. In this state all signals from the shift register 102 are made "Lo" and the CRES signal in the reading circuit section is turned into the state of "Lo." Then all TFTs (T1-1 to T3-3) for switching become off and the switch elements RES1 to RES3 in the reading circuit also become off. The G electrodes of the all photoelectric conversion elements become open on a DC basis, but potentials are maintained because the photoelectric conversion elements are also capacitors. However, since no light is incident to the photoelectric conversion elements at this point, no charge is generated. Namely, no electric current flows. When the light source is turned on pulsewise in this state, the D electrode (N$^+$ electrode) of each photoelectric conversion element is exposed to the light, so that the so-called photocurrent flows. Although the light source is not illustrated specifically in FIG. 20, it is, for example, a fluorescent tube, an LED, a halogen lamp, or the like in the case of the copiers. In the case of the X-ray imaging apparatus the light source is nothing but the X-ray source and in this case, a scintillator is used for conversion between X-rays and visible light. The photocurrent flowing due to this light is accumulated as a charge in each photoelectric conversion element and is retained after off of the light source.

Then the operation transfers to the reading period, but the operation is exactly the same as in the contents described in Embodiment 1 and description thereof is omitted herein.

An image is obtained through the refresh period, photoelectric conversion period, and reading period, and the above operation is repeated for obtaining a plurality of images such as moving pictures. Since the present embodiment is constructed in such an arrangement that the D electrodes of the photoelectric conversion elements are connected to the common wire and that this common wire is controlled by the VSC signal between the potentials of the refresh power supply VREF and reading power supply VS, the all photoelectric conversion elements can be switched simultaneously between the refresh mode and the photoelectric conversion mode. Because of this arrangement, a photooutput can be obtained by one TFT per pixel without performing complex control.

Embodiment 10

Figure 23:
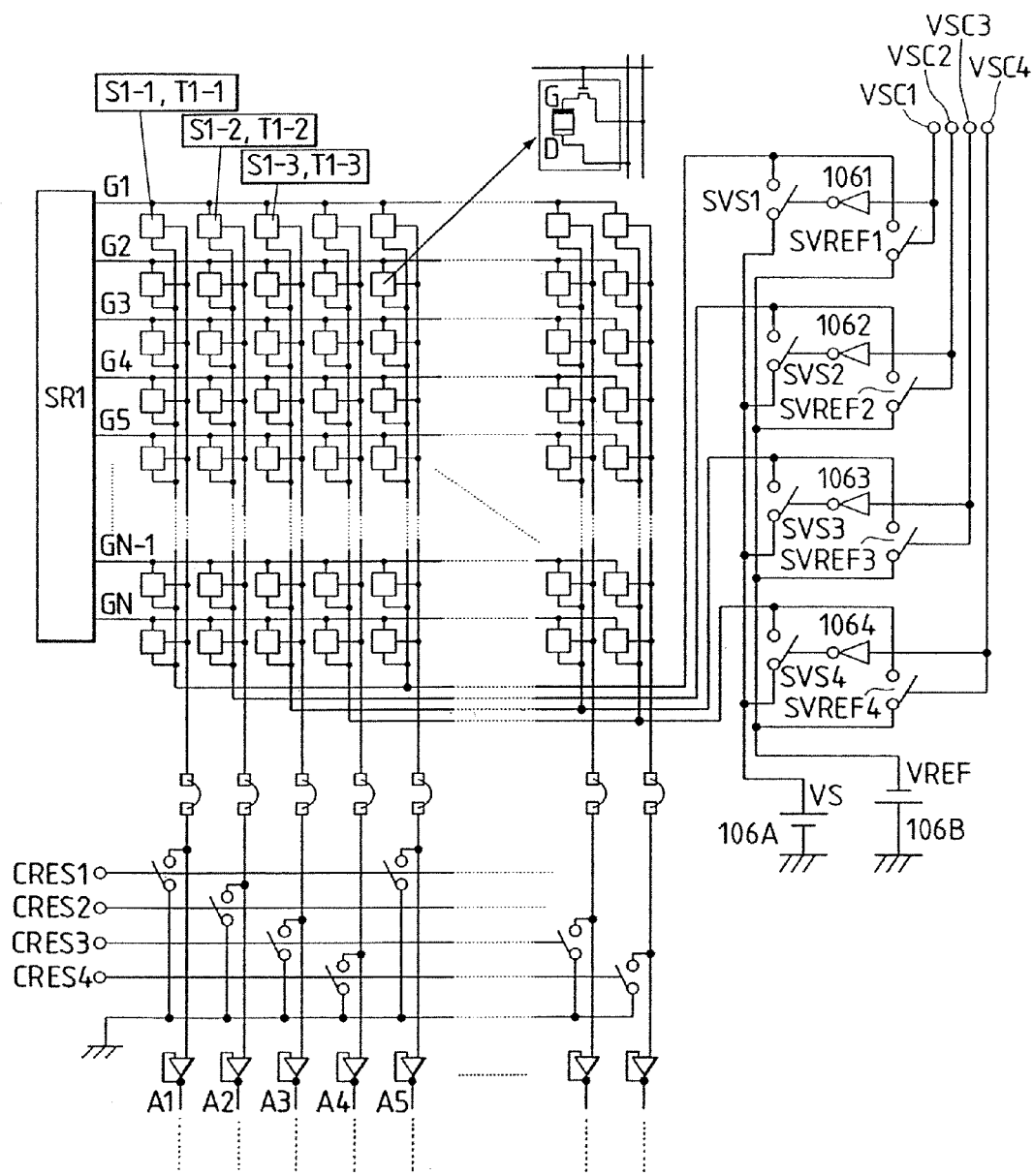
FIG. 23 is a schematic circuit diagram for explaining an example of the photoelectric conversion apparatus.

FIG. 23 is a schematic circuit diagram of a photoelectric conversion apparatus for explaining the tenth embodiment of the present invention. In FIG. 23, each set of photoelectric conversion element and switching TFT is illustrated simply by a square for simplicity of drawing. The present embodiment is characterized in that there are four groups of power-supply circuits for switching the refresh power supply to the reading power supply and vice versa and, in addition thereto, four groups of reset circuits for resetting the matrix signal wires. Switching of power supply is effected by VSC1 to VSC4 and switching of reset by CRES1 to CRES4. Portions corresponding to the operational amplifiers A1 to A3 in the reading circuit 107 in FIG. 20 are also the operational amplifiers of A1 to A3 in FIG. 23. For simplicity of drawing the circuit part after the operational amplifier A1 is omitted, but it may be considered to be the same as in FIG. 20. FIG. 23 is illustrated not in the number of pixels being 3×3=9 pixels, but is illustrated as assuming much more pixels. Further, the number of columns in FIG. 23 is assumed to be 4×N (N: natural number).

Next, an example of the operation of the present embodiment will be described using the timing chart of FIG. 24.

With VSC1 being in the "Hi" state and with CRES1 signal also being in the "Hi" state, when the G1 signal of shift register (SR1) becomes "Hi," the photoelectric conversion elements S1-1, S1-5, S1-9, ..., i.e., the photoelectric conversion elements corresponding to the (4×l+1) columns (l: integers not less than 0) on the first row, are refreshed. Similarly, G2, G3, ..., GN are successively turned to "Hi" and at the time of completion of the shift register operation, refresh is completed for the all photoelectric conversion elements corresponding to the first column, the fifth column, the ninth column, ..., i.e., the (4×l+1) columns (l: integers not less than 0). During this period, the photoelectric conversion elements in the other columns, i.e., the photoelectric conversion elements in the second column, the sixth column, the tenth column, ..., and the third column, the seventh column, the eleventh column, ..., and the fourth column, the eighth column, the twelfth column, ..., are in a state of the reading operation performed by the reading circuit section, because VSC2, VSC3, VSC4 corresponding to the respective columns are in the "Lo" state (where the D electrodes are biased to VS) and the signals of CRES2, CRES3, CRES4 repeat the normal reset operation (in the same manner as the CRES signal of FIG. 4).

Next, VSC1 is transitioned from the "Hi" state to the "Lo" state and the CRES1 signal is maintained in the "Hi" state. In that state the shift register SR1 is operated normally from G1 to GN. At the time of completion of the shift register operation, the D electrodes of the all photoelectric conversion elements corresponding to the first column, the fifth column, the ninth column, ..., that is, the (4×l+1) columns (l: integers not less than 0) are biased to the reading power supply VS, while the G electrodes thereof are kept in the state of the GND potential. Namely, the operation mode is shifted into the photoelectric conversion mode. On the other hand, the photoelectric conversion elements in the other columns, i.e., the photoelectric conversion elements in the second column, the sixth column, the tenth column, ..., and the third column, the seventh column, the eleventh column, ..., and the fourth column, the eighth column, the twelfth column, ..., are in the state of the reading operation performed by the reading circuit section, because VSC2, VSC3, VSC4 corresponding to the respective columns are in the "Lo" state (the D electrodes are biased to VS) and the signals of CRES2, CRES3, CRES4 repeat the normal reset operation (in the same manner as the CRES signal of FIG. 4).

Namely, in the process wherein the photoelectric conversion elements corresponding to the (4×l+1) columns (l: integers not less than 0) are refreshed in a certain period and are shifted into the photoelectric conversion mode in the next period, the photoelectric conversion elements in the other columns are subjected to two consecutive reading operations. The series of these operations are repeated as successively shifting the phases of the operations of the four groups of the (4×l+1) columns, the (4×l+2) columns, the (4×l+3) columns, and the (4×l+4) columns (l: integers not less than 0) one from another, as shown in FIG. 24.

Figure 24:
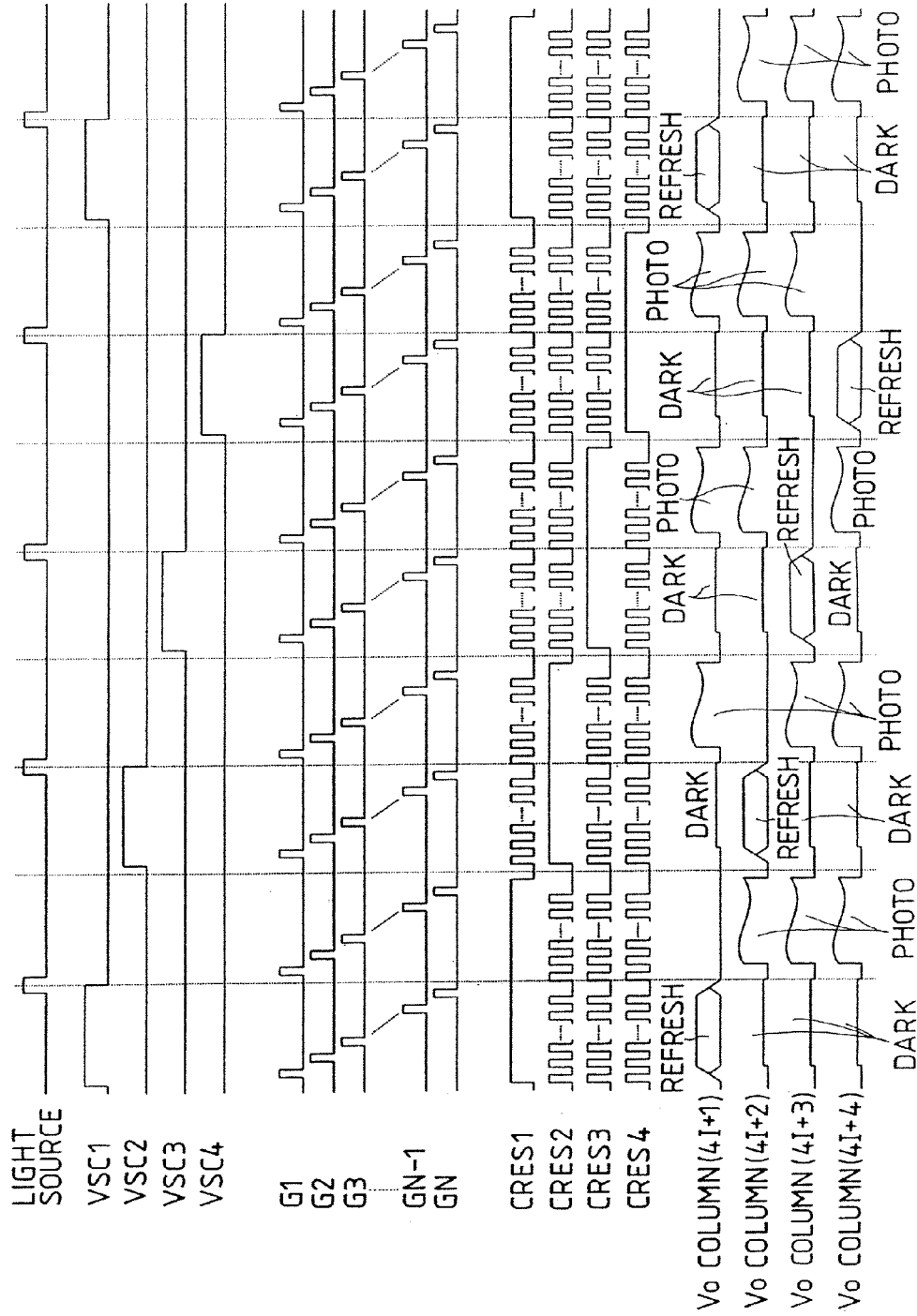
FIG. 24 is a timing chart for explaining an example of drive of the photoelectric conversion apparatus.

If the light source is turned on and off at the timing shown in FIG. 24, the photoelectric conversion elements in the three groups under the two consecutive reading operations output information of the dark state in the first frame and output information of the state of exposure to the light in the next frame. Although not illustrated in FIG. 23, correction can be made for the information of the dark state (the fixed pattern noise: FPN) by subtraction thereof in the digital process circuit after the A/D conversion circuit section of later stage. If data of photoelectric conversion elements in the columns under refresh is interpolated with data of photoelectric conversion elements under the reading operation in the adjacent columns, image data continuous in time series can be attained in the moving-picture mode.

To perform the refresh operation separately for each of the four groups as described in the present embodiment is effective especially in obtaining continuous moving images, which can increase the frame rate of moving picture substantially.

If the shift operation is carried out to turn four rows simultaneously on in such a way as to turn G1 to G4 of shift register SR1 simultaneously on, then to turn G5 to G8 simultaneously on, next to turn G9 to G12 simultaneously on, and so on, average information will be obtained of photoelectric conversion elements in four adjacent rows and the scanning speed will be shortened to a quarter. Further, if an averaging process of pixel data of three non-refreshed groups (three columns) is carried out in the column direction in the digital process circuit of later stage and, for example, supposing the present photoelectric conversion apparatus is constructed in the matrix of 2000 rows×2000 columns, the data can be compressed to that of 500 rows×500 columns, which can also be displayed on a commercially available and cheap CRT. In this case, 4×4=16 pixels are combined into one pixel in a certain frame because of execution of refresh, which will cause deviation of the center of gravity of pixel. However, it is averaged in four frame units as a result and thus causes no specific trouble.

In the present embodiment the refresh was described with the four groups, but without having to be limited to the four groups, a plurality of groups may be set depending upon the purpose.

As detailed above, the present invention can provide the photoelectric conversion apparatus that can reduce the reading scanning time and can enable high-speed reading and the system having the apparatus.

Also, the present invention can provide the photoelectric conversion apparatus that can perform reading of signal of high S/N with little occurrence of thermal noise (KTC noise) and the system having the apparatus.

In addition, the present invention can provide the photoelectric conversion apparatus that can obtain good image information without density unevenness and without unnecessary stripes, decreased in the fixed pattern noise, and the system having the apparatus.

Further, the present invention can provide the photoelectric conversion apparatus that can obtain the image information excellent in tone level and the system having the apparatus.

Additionally, the present invention can provide the photoelectric conversion apparatus that can easily compensate for unevenness of characteristics caused by the manufacturing dispersion of photoelectric conversion element or the like and that can promote further reduction of cost and the system having the apparatus.

More specifically, in the reading circuit section, the amplified output signals from the matrix signal lines of each photoelectric conversion circuit section are transferred once to the reading capacitors by the transfer switches and thereafter are successively switched by the reading switches, whereby the reading scanning time for one row can be decreased greatly as compared with that in the conventional apparatus. Namely, the present invention can provide the photoelectric conversion apparatus and system permitting high-speed reading.

According to the present invention, the first-stage analog operational amplifiers in the reading circuit section have low-noise performance, whereby the obtained outputs become unlikely to be affected by the KTC noise occurring in the photoelectric conversion circuit section. Namely, the present invention can provide the photoelectric conversion apparatus and system with high S/N. Also, by connecting the capacitor elements for letting only the AC components pass in series with the output terminals of the foregoing analog operational amplifiers and locating the reset switches for DC restoration of the capacitor elements, a drop of S/N due to the KTC noise occurring upon reset of the photoelectric conversion circuit section can be suppressed, the photoelectric conversion apparatus and system with high S/N can be provided, and high-quality images without roughness can be obtained.

Further, according to the present invention, by having the function to reduce the consumption current of the OP amps used in the reading circuit section in the so-called standby state where the reading operation is not carried out, heat generation of IC can be restricted and the dark current of the switching elements in the photoelectric conversion circuit section upon operation can be decreased. Namely, the present invention decreases the fixed pattern noise of the photoelectric conversion apparatus, thereby obtaining excellent images without density unevenness in the plane and without stripes.

Also, according to the present invention, in the A/D conversion circuit section, N (N: 2 or more) operational amplifiers for amplifying the signal from the reading circuit section are provided, N A/D converters of M bits are provided, the ratio of amplification factors G1, G2, . . . , GN of the N operational amplifiers is set to $G1:G2: \ldots :GN=2^0: 2^1: \ldots :2^{N-1}$, outputs from the N operational amplifiers are input to the N A/D converters, respectively, an output from one A/D converter out of the N A/D converters is selected in accordance with the output level of the analog signal from the reading circuit section, and it is output as a digital value of (N+M−1) bits, whereby the photoelectric conversion signal can be A/D-converted in high resolution and at high speed. Namely, the present invention can obtain image data of high tone level. In addition, the photoelectric conversion apparatus of the present invention may also be suitably applied to a system such as the high-performance medical X-ray image pickup apparatus.

Further, the photoelectric conversion elements and switching elements in the photoelectric conversion circuit section are made of the amorphous silicon semiconductor material, whereby the large-area photoelectric conversion apparatus can be provided cheaply by the easy processes. In addition, when it is provided with the function capable of controlling the amplification factors of the analog operational amplifiers in the matrix signal wires in the reading circuit section by the signal from the outside, it is easy to compensate for the gain dispersion due to the film thickness dispersion on fabrication of amorphous silicon semiconductor thin film, which can promote reduction of cost of apparatus.

As having been described above, the photoelectric conversion apparatus of the present invention is very excellent in respect of the speed, S/N, tone level, and cost, can meet the demand for "digitization of X-ray image information" strongly desired in the medical and industrial fields these years, and can improve the diagnostic efficiency in the hospitals not only in Japan going into the aging society, but also in the whole world, and the examination efficiency of buildings and the other various members and dealing efficiency after examination.

It is noted that the present invention is by no means limited to the above embodiments, but modifications and/or combinations can be made if necessary within the scope of the spirit of the present invention.

What is claimed is:

1. A photoelectric conversion apparatus comprising:

a photoelectric conversion circuit section wherein a plurality of pixels are arranged, each of said pixels including a photoelectric conversion element for converting light into an electric charge and a switching element for outputting an electric signal based on the electric charge, and wherein the photoelectric conversion circuit section outputs the electric signals one row by one row in parallel from the pixels;

a driving circuit section for controlling a turning on of the switching elements one row by one row; and a reading circuit section including a sample and hold unit for sampling and holding the electric signals outputted in parallel, and a reading switch for reading sequentially as a serial signal the electric signals outputted in parallel and sampled and held by the sample and hold unit, wherein the reading circuit section performs the reading for one row of the pixels while the driving circuit section performs the turning on of the switching elements of the other row, wherein the photoelectric conversion circuit section outputs in parallel the electric signals one row by one row through a plurality of signal wires, the sample and hold unit includes capacitors each provided per each of the signal wires, and a transfer switch for transferring the electric signals outputted in parallel to the capacitors, and a time period during which the reading circuit section performs the reading for one row of the pixels is within another time period after the sampling and holding of the electric signals outputted in parallel of the one row of the pixels by the reading circuit section until the next sampling and holding of the electric signals outputted in parallel of the next row of the pixels by the reading circuit section, wherein the reading circuit section includes at least one analog amplifier disposed between signal wires and the transfer switch, and wherein the reading circuit section further includes a capacitor disposed between the at least one analog amplifier and the transfer switch and being connected in series to an output terminal of the at least one analog amplifier, a reset switch for reset of the capacitor and a resistor connected between the capacitor and the reset switch.

2. The photoelectric conversion apparatus according to claim 1, wherein the reading circuit section further includes a low pass filter connected to a terminal opposite to the terminal of the capacitor connected to the output terminal of the analog amplifier.

* * * * *